(12) United States Patent
Hetzel et al.

(10) Patent No.: US 8,166,442 B2
(45) Date of Patent: *Apr. 24, 2012

(54) LOCAL PREFERRED DIRECTION ARCHITECTURE

(75) Inventors: Asmus Hetzel, Berlin (DE); Anish Malhotra, Los Altos, CA (US); Akira Fujimura, Saratoga, CA (US); Etienne Jacques, Bristol (GB); Jon Frankle, Los Gatos, CA (US); David S. Harrison, Sunnyvale, CA (US); Heath Feather, North Andover, MA (US); Alexandre Matveev, San Jose, CA (US); Roger King, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 619 days.

This patent is subject to a terminal disclaimer.

(21) Appl. No.: 12/241,034

(22) Filed: Sep. 29, 2008

(65) Prior Publication Data
US 2009/0024977 A1  Jan. 22, 2009

Related U.S. Application Data

(60) Division of application No. 11/005,316, filed on Dec. 6, 2004, now Pat. No. 7,441,220, which is a continuation-in-part of application No. 09/733,104, filed on Dec. 7, 2000, now Pat. No. 6,858,928.

(60) Provisional application No. 60/577,434, filed on Jun. 4, 2004.

(51) Int. Cl.
*G06F 17/50* (2006.01)

(52) U.S. Cl. .......................... 716/126; 716/129; 716/130

(58) Field of Classification Search .................. 716/126, 716/129, 130
See application file for complete search history.

(56) References Cited

U.S. PATENT DOCUMENTS

| | | | |
|---|---|---|---|
| 4,571,451 A | 2/1986 | Linsker et al. |
| 4,615,011 A | 9/1986 | Linsker |
| 4,777,606 A | 10/1988 | Fournier |
| 4,855,253 A | 8/1989 | Weber |
| 4,855,929 A | 8/1989 | Nakajima |

(Continued)

FOREIGN PATENT DOCUMENTS

JP  04000677  1/1992

(Continued)

OTHER PUBLICATIONS

U.S. Appl. No. 11/457,272, filed Jul. 13, 2006, Wadland, Ken, et al.

(Continued)

*Primary Examiner* — Vuthe Siek
(74) *Attorney, Agent, or Firm* — Adeli & Tollen LLP

(57) ABSTRACT

Some embodiments of the invention provide a Local Preferred Direction (LPD) wiring model for use with one or more EDA tools (such as placing, routing, etc). An LPD wiring model allows at least one wiring layer to have a set of regions that each have a different preferred direction than the particular wiring layer. In addition, each region has a local preferred direction that differs from the local preferred direction of at least one other region in the set. Furthermore, at least two regions have two different polygonal shapes and no region in the set encompasses another region in the set. Some embodiments also provide a Graphical User Interface (GUI) that facilitates a visual presentation of an LPD design layout and provides tools to create and manipulate LPD regions in a design layout.

29 Claims, 28 Drawing Sheets

U.S. PATENT DOCUMENTS

| | | | |
|---|---|---|---|
| 4,910,680 | A | 3/1990 | Hiwatashi |
| 5,375,069 | A | 12/1994 | Satoh et al. |
| 5,541,005 | A | 7/1996 | Bezama et al. |
| 5,635,736 | A | 6/1997 | Funkaki et al. |
| 5,650,653 | A | 7/1997 | Rostoker et al. |
| 5,673,201 | A | 9/1997 | Malm et al. |
| 5,723,908 | A | 3/1998 | Fuchida et al. |
| 5,737,237 | A | 4/1998 | Tanaka et al. |
| 5,798,936 | A | 8/1998 | Cheng |
| 5,801,385 | A | 9/1998 | Endo et al. |
| 5,801,960 | A | 9/1998 | Takano et al. |
| 5,811,863 | A | 9/1998 | Rostoker et al. |
| 5,814,847 | A | 9/1998 | Shihadeh et al. |
| 5,822,214 | A | 10/1998 | Rostoker et al. |
| 5,880,969 | A | 3/1999 | Hama et al. |
| 5,980,093 | A | 11/1999 | Jones et al. |
| 6,006,024 | A | 12/1999 | Guruswamy et al. |
| 6,014,507 | A | 1/2000 | Fujii |
| 6,077,309 | A | 6/2000 | Lin |
| 6,209,123 | B1 | 3/2001 | Maziasz et al. |
| 6,256,769 | B1 | 7/2001 | Tamarkin et al. |
| 6,262,487 | B1 | 7/2001 | Igarashi et al. |
| 6,263,475 | B1 | 7/2001 | Toyonaga et al. |
| 6,324,674 | B2 | 11/2001 | Andreev et al. |
| 6,330,707 | B1 | 12/2001 | Shinomiya et al. |
| 6,407,434 | B1 | 6/2002 | Rostoker et al. |
| 6,441,470 | B1 | 8/2002 | Shenoy |
| 6,448,591 | B1 | 9/2002 | Juengling |
| 6,526,555 | B1 | 2/2003 | Teig et al. |
| 6,601,222 | B1 | 7/2003 | Mehrotra et al. |
| 6,671,864 | B2 | 12/2003 | Teig et al. |
| 6,711,727 | B1 | 3/2004 | Teig et al. |
| 6,769,105 | B1 | 7/2004 | Teig et al. |
| 6,772,406 | B1 | 8/2004 | Trimberger |
| 6,792,587 | B2 | 9/2004 | Xing et al. |
| 6,858,928 | B1 | 2/2005 | Teig et al. |
| 6,870,255 | B1 | 3/2005 | Teig et al. |
| 6,889,371 | B1 | 5/2005 | Teig et al. |
| 6,889,372 | B1 | 5/2005 | Teig et al. |
| 6,898,773 | B1 | 5/2005 | Teig et al. |
| 6,910,198 | B2 | 6/2005 | Teig et al. |
| 6,915,500 | B1 | 7/2005 | Teig et al. |
| 6,973,634 | B1 | 12/2005 | Teig et al. |
| 6,988,258 | B2 | 1/2006 | Tan et al. |
| 6,996,789 | B2 | 2/2006 | Teig et al. |
| 7,003,748 | B1 | 2/2006 | Hsu |
| 7,003,752 | B2 | 2/2006 | Teig et al. |
| 7,010,771 | B2 | 3/2006 | Teig et al. |
| 7,013,445 | B1 | 3/2006 | Teig et al. |
| 7,024,650 | B2 | 4/2006 | Teig et al. |
| 7,036,101 | B2 | 4/2006 | He et al. |
| 7,036,105 | B1 | 4/2006 | Teig et al. |
| 7,047,513 | B2 | 5/2006 | Teig et al. |
| 7,058,919 | B1 | 6/2006 | Young et al. |
| 7,062,743 | B2 | 6/2006 | Kahng et al. |
| 7,080,342 | B2 | 7/2006 | Teig et al. |
| 7,086,024 | B2 | 8/2006 | Hsu et al. |
| 7,096,449 | B1 | 8/2006 | Teig et al. |
| 7,117,468 | B1 | 10/2006 | Teig et al. |
| 7,171,635 | B2 | 1/2007 | Teig et al. |
| 7,174,529 | B1 | 2/2007 | Hetzel |
| 7,185,304 | B2 | 2/2007 | Suto et al. |
| 7,197,738 | B1 | 3/2007 | Hetzel et al. |
| 7,340,711 | B2 | 3/2008 | Hetzel et al. |
| 7,412,682 | B2 | 8/2008 | Malhotra et al. |
| 7,441,220 | B2 | 10/2008 | Hetzel et al. |
| 7,480,885 | B2 | 1/2009 | Frankle et al. |
| 7,493,581 | B2 | 2/2009 | Siegel et al. |
| 7,707,537 | B2 | 4/2010 | Malhotra et al. |
| 2001/0039643 | A1 | 11/2001 | Kuroda et al. |
| 2002/0053067 | A1 | 5/2002 | Kanazawa |
| 2002/0100009 | A1 | 7/2002 | Xing et al. |
| 2003/0009737 | A1 | 1/2003 | Xing |
| 2003/0084416 | A1 | 5/2003 | Dai et al. |
| 2005/0071797 | A1 | 3/2005 | Fuji |
| 2005/0138578 | A1 | 6/2005 | Alpert et al. |
| 2005/0138593 | A1 | 6/2005 | Okumura |
| 2005/0240894 | A1 | 10/2005 | Teig et al. |
| 2005/0273746 | A1 | 12/2005 | Malhotra et al. |
| 2006/0156266 | A1 | 7/2006 | Alpert et al. |
| 2010/0180250 | A1 | 7/2010 | Malhotra et al. |

FOREIGN PATENT DOCUMENTS

| | | |
|---|---|---|
| WO | WO 2005/122027 | 12/2005 |
| WO | WO 2005/122028 | 12/2005 |

OTHER PUBLICATIONS

Portions of prosecution history of U.S. Appl. No. 11/005,316, Sep. 5, 2008, Hetzel, Asmus, et al.

Portions of prosecution history of U.S. Appl. No. 11/005,169, Apr. 10, 2008, Malhotra, Anish, et al.

Portions of prosecution history of U.S. Appl. No. 11/005,448, Dec. 7, 2007, Hetzel, Asmus, et al.

Portions of prosecution history of U.S. Appl. No. 11/005,162, Dec. 1, 2009, Malhotra, Anish, et al.

Portions of prosecution history of U.S. Appl. No. 09/733,104, Nov. 16, 2004, Teig, Steven, et al.

Portions of prosecution history of U.S. Appl. No. 11/031,472, Jul. 9, 2007, Teig, Steven, et al.

International Search Report and Written Opinion of PCT/US2005/019361, Sep. 6, 2006 (mailing date), Cadence Design Systems, Inc.

International Preliminary Report on Patentability Chapter 1 of PCT/US2005/019361, Dec. 4, 2006 (Issuance date), Cadence Design Systems, Inc.

International Preliminary Report on Patentability Chapter 2 of PCT/US2005/019361, May 25, 2007 (Issuance date), Cadence Design Systems, Inc.

International Search Report and Written Opinion of PCT/US2005/019359, Feb. 15, 2006 (mailing date), Cadence Design Systems, Inc.

International Preliminary Report on Patentability of PCT/US2005/019359, Dec. 4, 2006 (Issuance date), Cadence Design Systems, Inc.

Cheng-Kok Koh and Patrick H. Madden, "Manhattan or Non Manhattan? A Study of Alternative VLSI Routing Architectures," 2000, pp. 47-52.

Ousterhout, "Corner Stitching: A data-Structuring Technique for VLSI Layout Tools", IEEE Transactions on Computer-Aided Design, Jan. 1984, vol. CAD-3, No. 1.

U.S. Appl. No. 12/731,078, filed Mar. 24, 2010, Malhotra, Anish, et al.

Portions of prosecution history of U.S. Appl. No. 11/457,272, Feb. 19, 2010, Wadland, Ken, et al.

Updated portions of prosecution history of U.S. Appl. No. 11/005,316, Sep. 10, 2008, Hetzel, Asmus, et al.

Updated portions of prosecution history of U.S. Appl. No. 11/005,169, May 1, 2008, Malhotra, Anish, et al.

Portions of prosecution history of U.S. Appl. No. 12/731,078, Apr. 8, 2011, Malhotra, Anish, et al.

Updated portions of prosecution history of U.S. Appl. No. 11/457,272, Jul. 19, 2010, Wadland, Ken, et al.

U.S. Appl. No. 13/180,448, filed Jul. 11, 2011, Malhotra, Anish, et al.

Updated portions of prosecution history of U.S. Appl. No. 12/731,078, Jul. 8, 2011, Malhotra, Anish, et al.

Updated portions of prosecution history of U.S. Appl. No. 12/731,078, May 25, 2011, Malhotra, Anish, et al.

LOCAL PREFERRED DIRECTION ARCHITECTURE

CLAIM OF BENEFIT TO PRIOR APPLICATIONS

This application is a divisional application of U.S. patent application Ser. No. 11/005,316, now issued as U.S. Pat. No. 7,441,220, filed on Dec. 6, 2004. U.S. patent application Ser. No. 11/005,316 claims the benefit of U.S. Provisional Patent Application 60/577,434, filed on Jun. 4, 2004. U.S. patent application Ser. No. 11/005,316 is also a continuation-in-part application of U.S. patent application Ser. No. 09/733,104, now issued as U.S. Pat. No. 6,858,928, filed on Dec. 7, 2000.

FIELD OF THEE INVENTION

The invention is directed towards an apparatus for routing nets using a Local Preferred Direction wiring model.

BACKGROUND OF THE INVENTION

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. An IC also includes multiple layers of metal and/or polysilicon wiring that interconnect its electronic and circuit components. For instance, many ICs are currently fabricated with five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has one global preferred wiring direction, and the preferred direction alternates between successive metal layers.

Many ICs use the Manhattan wiring model that specifies alternating layers of horizontal and vertical preferred direction wiring. In this wiring model, the majority of the wires can only make 90° turns. Occasional diagonal jogs are sometimes allowed on the preferred horizontal and vertical layers. Standard routing algorithms heavily penalize these diagonal jogs (i.e. assess proportionally high routing-costs), however, because they violate the design rules of the Manhattan wiring model. Some have recently proposed ICs that use a diagonal wiring model to provide design rules that do not penalize diagonal interconnect lines (wiring). Interconnect lines are considered "diagonal" if they form an angle other than zero or ninety degrees with respect to the layout boundary of the IC. Typically however, diagonal wiring consists of wires deposed at ±45 degrees.

Typical Manhattan and diagonal wiring models specify one preferred direction for each wiring layer. Design difficulties arise when routing along a layer's preferred direction because of obstacles on these wiring layers. For example, design layouts often contain circuit components, pre-designed circuit blocks, and other obstacles to routing on a layer. Such obstacles may cause regions on a layer to become essentially unusable for routing along the layer's single preferred direction.

An example that shows obstacles that cause regions on a design layout to become unusable for routing is illustrated in FIG. 1. This figure shows two wiring layers that each have two routing obstacles 115 and 120. One of the layers has a horizontal preferred direction; the other layer has a diagonal preferred direction. The obstacles 115 and 120 cause two regions 105 and 110 to become unusable for routing on both of these layers. Therefore, both the Manhattan and diagonal wiring models typically waste routing resources on the layers of a design layout.

Accordingly, a need exists for a wiring model that allows Manhattan and diagonal wiring and recaptures the routing resources lost because of obstacles on a wiring layer.

SUMMARY OF THE INVENTION

Some embodiments of the invention provide a Local Preferred Direction (LPD) wiring model for use with one or more EDA tools (such as placing, routing, etc). An LPD wiring model allows at least one wiring layer to have a set of regions that each have a different preferred direction than the particular wiring layer. In addition, each region has a local preferred direction that differs from the local preferred direction of at least one other region in the set. Furthermore, at least two regions have two different polygonal shapes and no region in the set encompasses another region in the set. Some embodiments also provide a Graphical User Interface (GUI) that facilitates a visual presentation of an LPD design layout and provides tools to create and manipulate LPD regions in a design layout.

BRIEF DESCRIPTION OF THE DRAWINGS

The novel features of the invention are set forth in the appended claims. For purposes of explanation, however, several embodiments of the invention are set forth in the following figures.

DETAILED DESCRIPTION OF THE INVENTION

Figure 1:
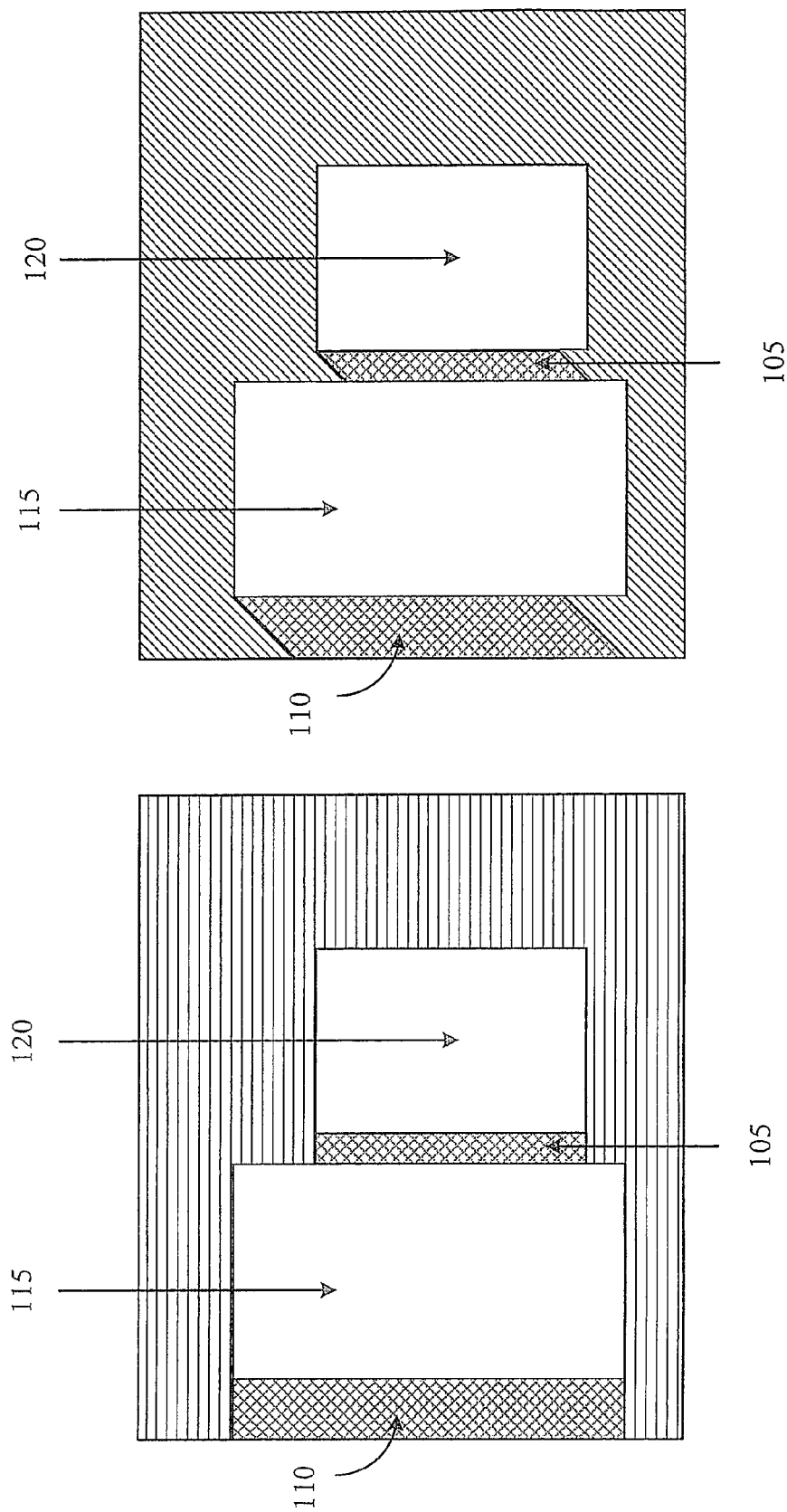
FIG. 1 illustrates an example of regions essentially unusable for routing due to obstacles on a typical Manhattan and diagonal wiring layer.

The invention is directed towards an apparatus for routing nets using a Local Preferred Direction wiring model. In the following description, numerous details are set forth for purpose of explanation. One of ordinary skill in the art will realize, however, that the invention may be practiced without the use of these specific details. In some instances, well-known structures and devices are shown in block diagram form to simplify the description of the invention.

Some embodiments of the invention provide a Local Preferred Direction (LPD) wiring model for use with one or more EDA tools (such as placing, routing, etc). An LPD wiring model allows at least one wiring layer to have a set of regions that each have a different preferred direction than the particular wiring layer. In addition, each region has a local preferred direction that differs from the local preferred direction of at least one other region in the set. Furthermore, at least two regions have two different polygonal shapes and no region in the set encompasses another region in the set. Some embodiments also provide a Graphical User Interface (GUI) that facilitates a visual presentation of an LPD design layout and provides tools to create and manipulate LPD regions in a design layout.

Several features of the LPD Architecture will be discussed below. Section II describes some examples of the LPD Architecture and Section III describes a Graphic User Interface (GUI) for an EDA tool that employs an LPD wiring model. Before describing the examples of the LPD Architecture and the GUI, however, Section I describes an overview of the LPD wiring model.

I. Overview of Local Preferred Direction Wiring Model

The LPD wiring model of some embodiments allows for the creation of routes that have edges in the Manhattan or diagonal direction. A Manhattan edge is either horizontal (0°) or vertical (90°) with respect to one of the coordinate axes of the layout or IC. Conversely, a diagonal edge forms angles other than 0° or 90°. A diagonal edge typically forms a 45° angle with respect to the layout's or IC's coordinate axes. The coordinate axes are often parallel with the layout's boundary, the boundary of the layout's expected IC, or both.

Given a design layout or IC with several wiring layers, some embodiments describe the LPD wiring model of the layout or IC in terms of (1) several wiring layers, (2) a global preferred direction DL for each layer L, and (3) a potentially empty set of LPD regions for each wiring layer L. Some embodiments define a "preferred" direction as the direction that a majority of the wires are laid out in a region. Some embodiments further quantify this amount in terms of percentages or amount of the wiring. For example, some embodiments define the preferred direction of a layer as the direction for at least 50% of the wires (also called interconnect lines or route segments) on the layer. Other embodiments define the preferred direction of a layer as the direction for at least 1000 wires on the layer.

On a particular layer, a region is called an LPD region (or an LPDR) when the region has a local preferred wiring direction that is different than the global preferred wiring direction of the particular layer. Some embodiments impose several consistency requirements on an LPDR description. For instance, some embodiments require each LPDR to be entirely within the chip area. In some embodiments, all LPDRs on a given layer intersect only at their boundary (i.e., no overlaps). In addition, some embodiments require that all LPDRs are non-degenerate (contain at least one interior point).

II. LPD Architecture

Figure 2:
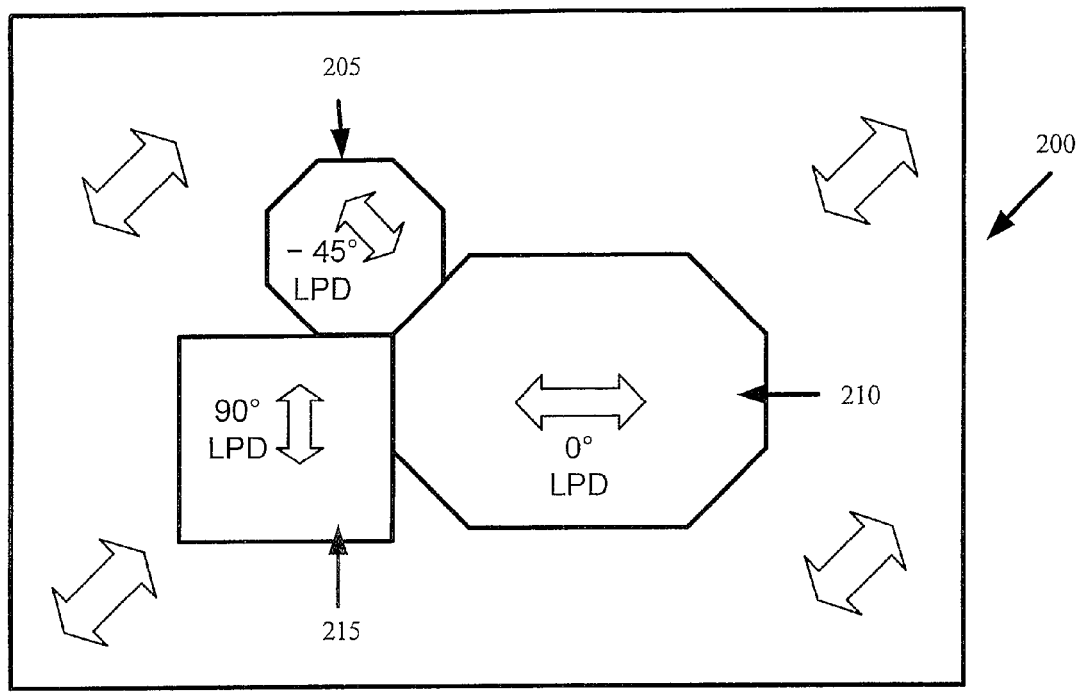
FIG. 2 illustrates an example of a design layout based upon an LPD wiring model.

As previously mentioned, an LPD wiring model allows at least one wiring layer to have several different local preferred directions in several different regions of the wiring layer. FIG. 2 illustrates an example of such a wiring layer in an IC or a design layout. This wiring layer has LPDRs that have several different convex shapes and local preferred directions according to some embodiments of the invention. This example shows a wiring layer 200 that has a 45° global preferred direction. On this layer 200 are an octagonal LPDR 205 that has a −45° local preferred direction, an octagonal LPDR 210 that has a horizontal local preferred direction, and a rectangular LPDR 215 that has a vertical local preferred direction.

Figure 3:
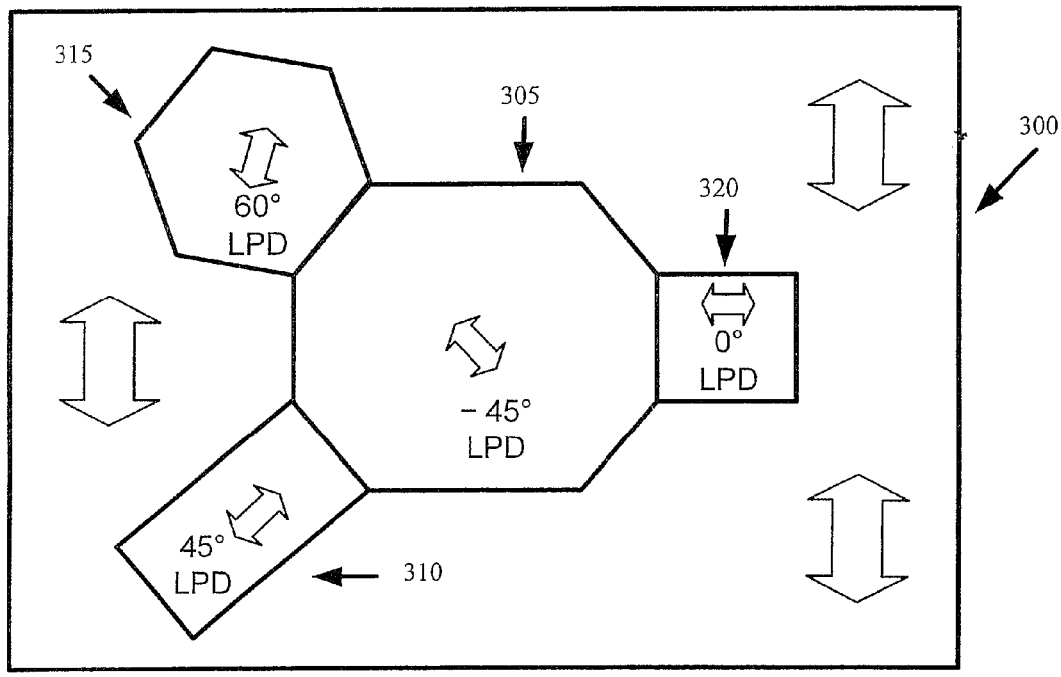
FIG. 3 illustrates another example of a design layout based upon an LPD wiring model.

FIG. 3 illustrates another example of another such wiring layer in an IC or a design layout. This wiring layer has LPD regions that have several different convex shapes according to some embodiments of the invention. This example shows a wiring layer 300 that has a vertical global preferred direction. This layer 300 has four LPDRs that have different convex shapes and different local preferred directions. In the center of layer 300 is an octagonal LPDR 305 with a −45° local preferred direction. Adjacent to the lower-left side of region 305 is a rectangular LPDR 310 with a 45° local preferred direction. Adjacent to the upper-left side of region 305 is a hexagonal LPDR 315 with a 60° local preferred direction. Adjacent to the right side of region 305 is a square LPDR 320 with a horizontal local preferred direction.

The examples illustrated above in FIGS. 2 and 3 demonstrate that an LPD wiring model allows a wiring layer to have several regions with different convex polygonal shapes and different local preferred directions. These examples however present simple uses of the LPD wiring model in a design layout or an IC. The examples do not illustrate any macros or other obstacles to the wiring on a layer. Macros are pre-designed complex circuit blocks used in a layout or an IC. Examples of such blocks include IP blocks, RAM cells, and Power Via Arrays. As previously mentioned, these and other obstacles to wiring may cause regions on a wiring layer to become essentially unusable for routing. One of the advantages of the LPD wiring model, however, is that it recovers routing resources normally lost because of macros and other obstacles on a wiring layer.

Figure 4A:
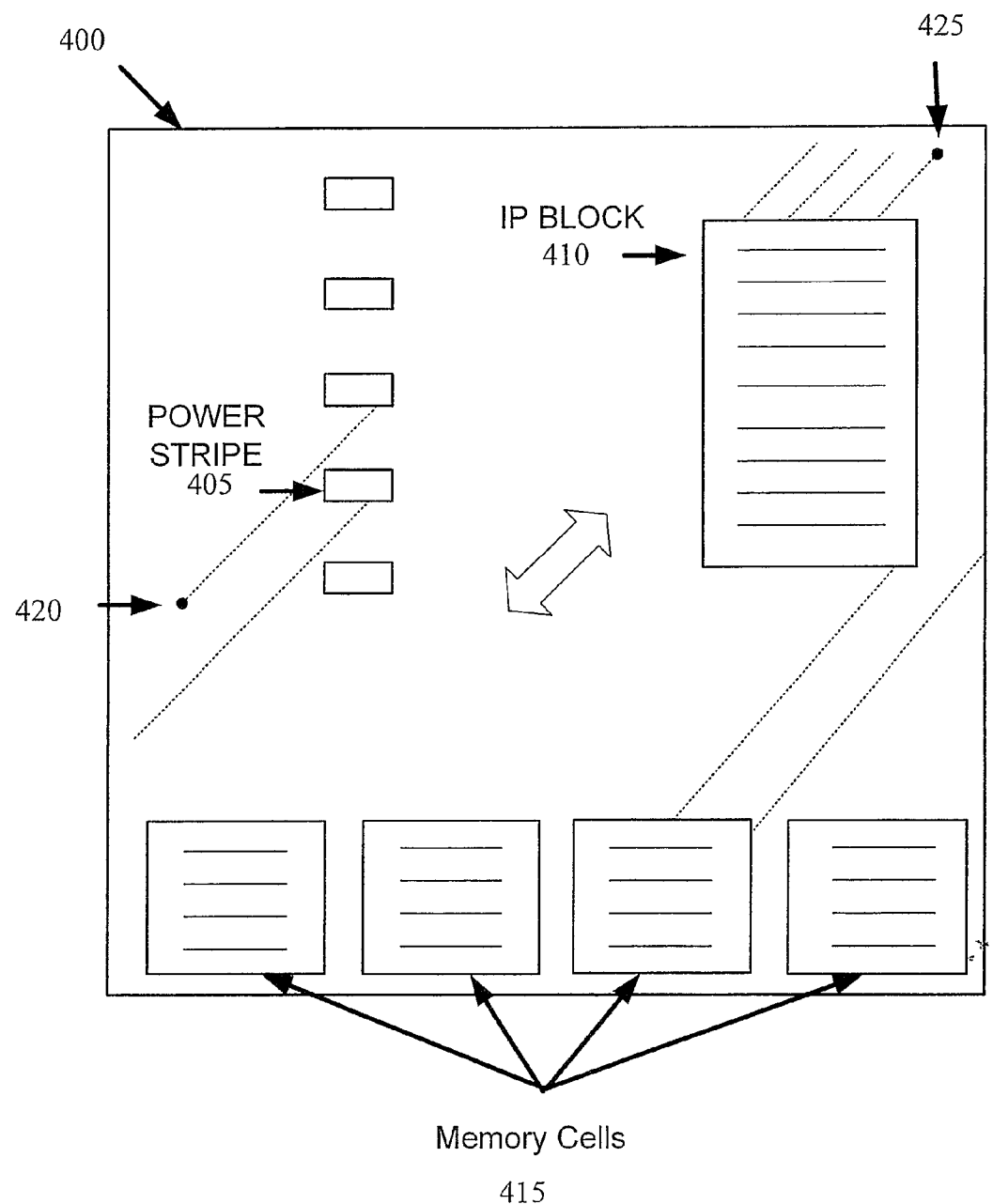
FIG. 4A illustrates a wiring layer with pre-designed circuit blocks.
Figure 4B:
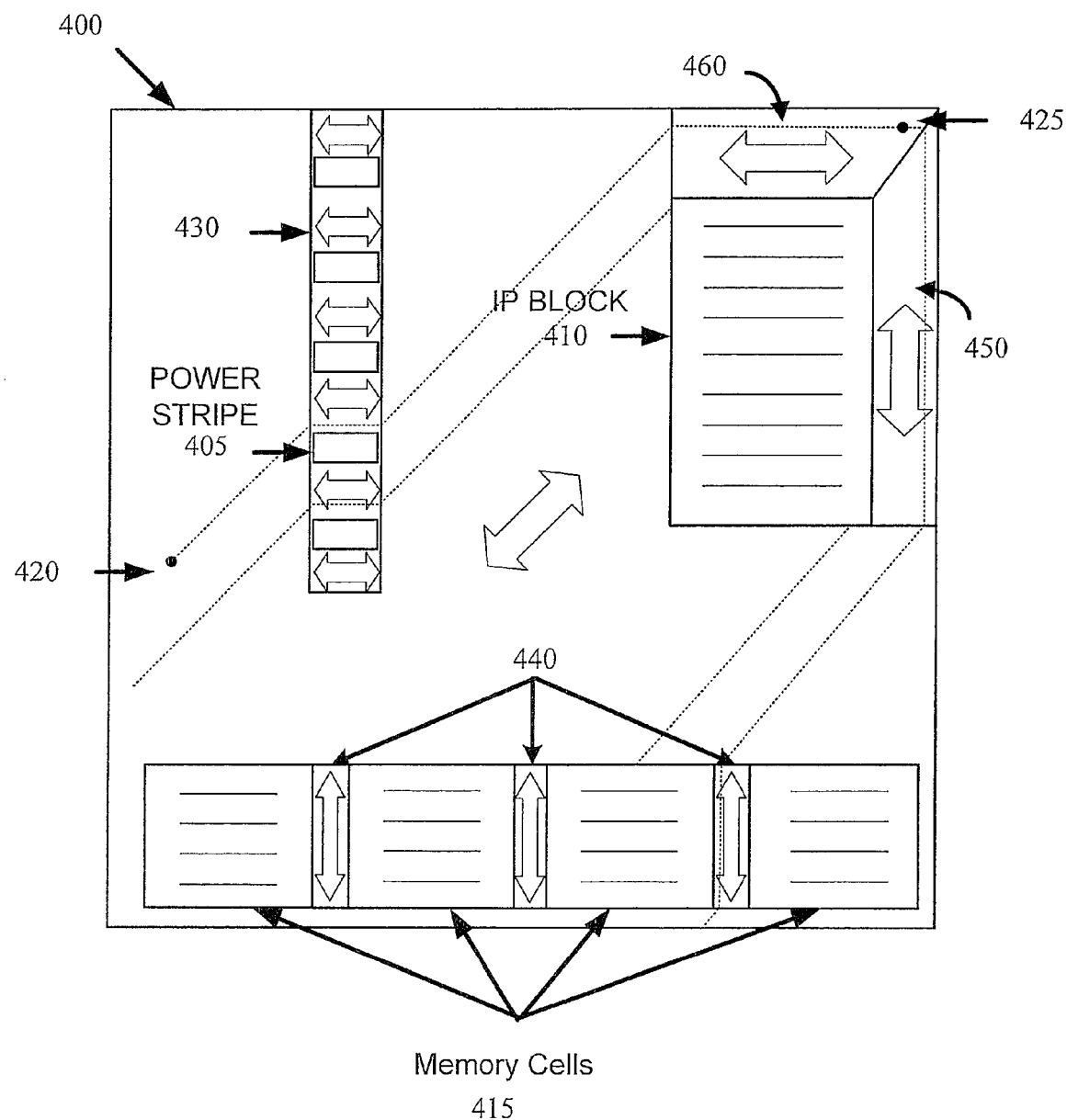
FIG. 4B illustrate the wiring layer of FIG. 4A with LPD regions.

FIGS. 4A and 4B provide examples that illustrate this particular advantage of the LPD wiring model. Specifically, FIG. 4A illustrates a wiring layer 400 that has a diagonal global preferred direction. This wiring layer includes a column of power via arrays (power stripe) 405, an IP block 410, a set of memory cells 415, and two pins 420 and 425. Also shown on this layer is diagonal wiring represented by dotted lines. The power stripe 405, IP block 410, and the set of memory cells 415 are all obstacles to wiring on the wiring layer. These obstacles may present routing difficulties as shown in FIG. 4A. A problem arises when pins 420 and 425 need to be connected to each other or to other pins because the diagonal wiring that connects to pin 420 is obstructed by the power via arrays 405. Furthermore, the diagonal wiring that connects to pin 425 is obstructed by the IP block 410.

To solve these routing problems, some embodiments define LPDRs about these obstacles that have local preferred directions running parallel to the edges of the obstacles. FIG. 4B illustrates examples of such LPDRs. An LPDR 430 that has a horizontal local preferred direction is defined to encompass the power via arrays 405. As an alternative, some embodiments define individual LPDRs between the power via arrays instead of encompassing them. In either case, the horizontal direction of the LPDRs allows wiring to route between the power via arrays 405.

This figure also shows three LPDRs 440 that have vertical local preferred directions defined between the RAM blocks 415. In addition, an LPDR 450 that has a vertical local preferred direction is defined between the right side of the IP block 410 and the right boundary of the wiring layer, and an LPDR 460 that has a horizontal local preferred direction is defined between the topside of the IP block 410 and the top boundary of the wiring layer. The boundary edge between LPDR 450 and LPDR 460 is defined as a 45° diagonal line to increase the capacity of the wiring between two such regions. Boundary edges as such are called "crowns", the advantages of which will be further described below.

The LPDRs illustrated in FIG. 4B allow wiring that was previously obstructed to now traverse around the obstacles by routing through these LPDRs along their local preferred directions. For instance, as shown in FIG. 4B, pins 420 and 425 can now be connected through a set of interconnect lines that traverse along the global 45° direction, traverse through the LPDR 430 in the horizontal direction, traverse again along the global 45° direction, and then traverse through the LPDR 460 in the horizontal direction.

A. Crowns

Some embodiments define a boundary edge between two regions as an "impermeable edge" when the edge runs parallel to either one of the local preferred directions of the two regions sharing the respective boundary edge. These boundary edges are considered impermeable because of geometric design constraints. For example, two sets of wires that run parallel to each other do not typically intersect. As such, the wiring in two regions that share an impermeable boundary edge will be impeded from intersecting at that edge.

In order to solve this potential routing problem, some embodiments of the invention "extend" these impermeable boundary edges with "crowns." A "crown" is an extension of an LPDR at a boundary between two regions. In some embodiments, a crown boundary is defined to not be parallel to either of the local preferred directions of the two regions sharing the crown boundary. These crowns thus form boundary edges that allow the intersection of wiring directed along the preferred directions of the regions sharing the boundary edge.

Figure 5A:
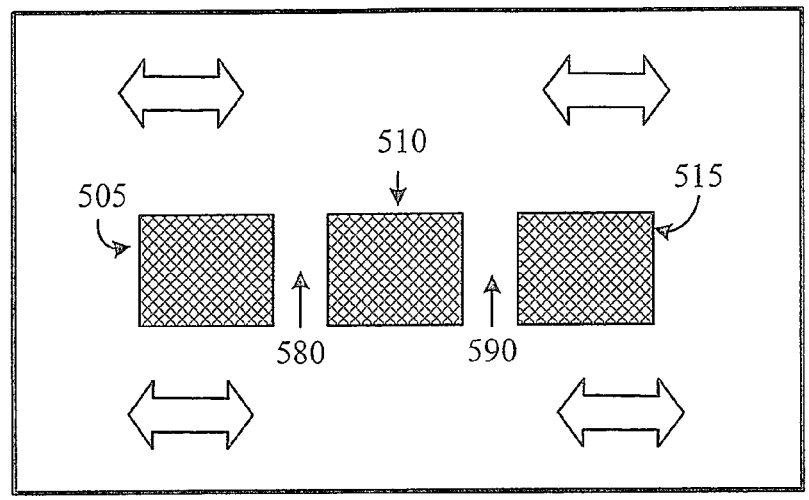
FIGS. 5A-5C illustrate LPD regions extended with crowns.
Figure 5B:
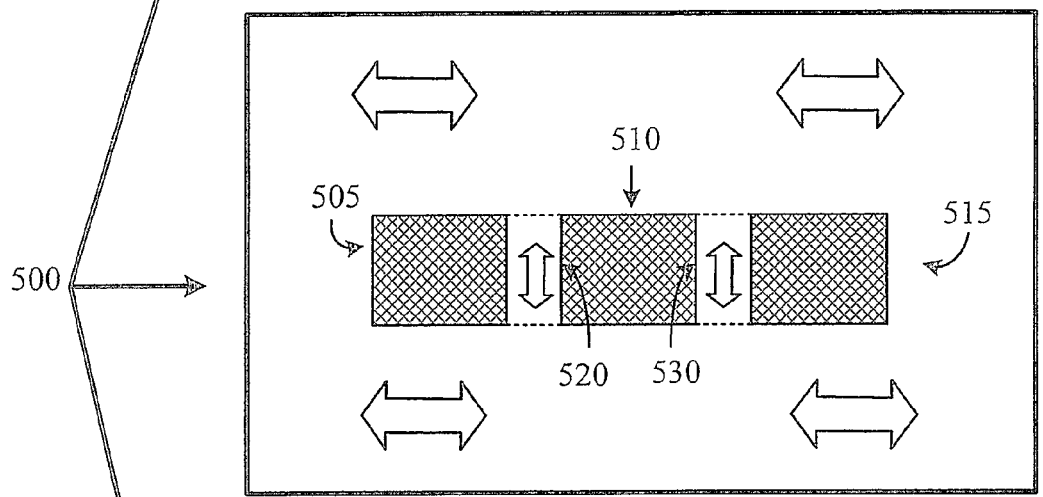
Figure 5C:
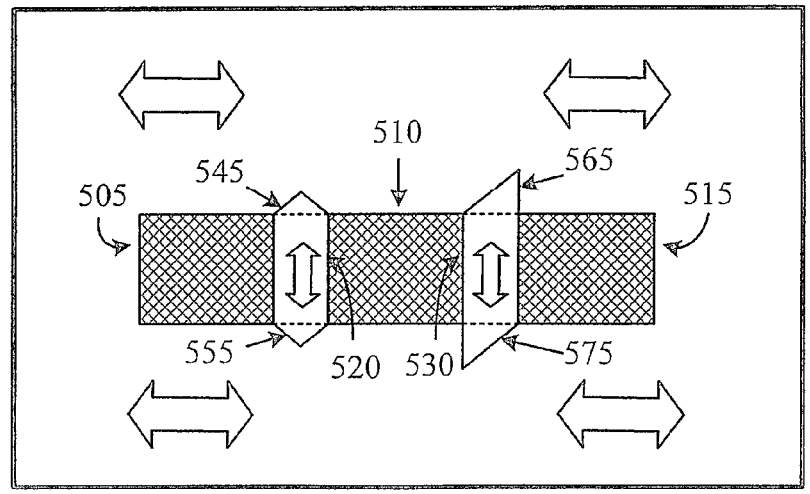

FIGS. 5A-5C illustrate a detailed example of extending boundary edges of LPDRs with "crowns". These figures illustrate a wiring layer 500 that has a horizontal global preferred direction. Positioned in the center of this layer are three pre-designed circuit blocks 505, 510, and 515. In addition, two channels 580 and 590 are located between the blocks 505 and 510 and blocks 510 and 515, respectively. These channels 580 and 590 are essentially unusable for routing in the horizontal direction of layer 500 because geometric constraints prohibit such wiring to enter or exit from the channels. In order to effectively utilize these channels, some embodiments of the invention replace the channels 580 and 590 with LPDRs 520 and 530 that have vertical local preferred directions as illustrated in FIG. 5B. Defining the LPDRs 520 and 530 in this manner, however, would create impermeable boundary edges at the upper and lower boundary edges of LPDRs 520 and 530 (represented by dashed lines) in some embodiments. These boundary edges are defined as impermeable because they run parallel to the preferred horizontal direction of the layer 500.

To avoid creating impermeable boundary edges, some embodiments of the invention add "crowns" to the LPDRs 520 and 530 as shown in FIG. 5C. Specifically, FIG. 5C illustrates an example of two triangular crowns 545 and 555 created to extend LPDR 520. This figure also illustrates two triangular crowns 565 and 575 created to extend LPDR 530. Crowns 545 and 555 are shaped differently than crowns 565 and 575. Crowns 545 and 555 are in the shape of an isosceles triangle; crowns 565 and 575 are in the shape of a right triangle. Both shapes of crowns, however, form boundary edges that intersect with the horizontal wiring from layer 500. Thus, the horizontal wiring is able to route into and out of LPDRs 520 and 530. The previously "un-routable" wiring space of the channels 580 and 590 is effectively utilized for wiring on layer 500.

Crowns can be defined to have various shapes. Typically however crowns are triangular. The two shapes of crowns previously presented in FIG. 5C differ not only in form but function as well. For example, the crowns shaped like an isosceles triangle form two boundary edges that intersect with the horizontal wiring of the layer. These edges allow wiring directed from both the left and the right of the crown to route through the LPDR. On the other hand, crowns shaped like a right triangle typically form one permeable edge. This edge typically allows wiring to route through an LPDR from either the left or from the right of the crown. This one edge however is typically longer and thus intersects more wiring when compared to a single edge of the isosceles shaped crown. Accordingly, some embodiments of the invention dynamically determine the shape of the crowns that will maximize the routing through the respective region in a particular design layout.

B. Merging LPD Regions

Figure 6:
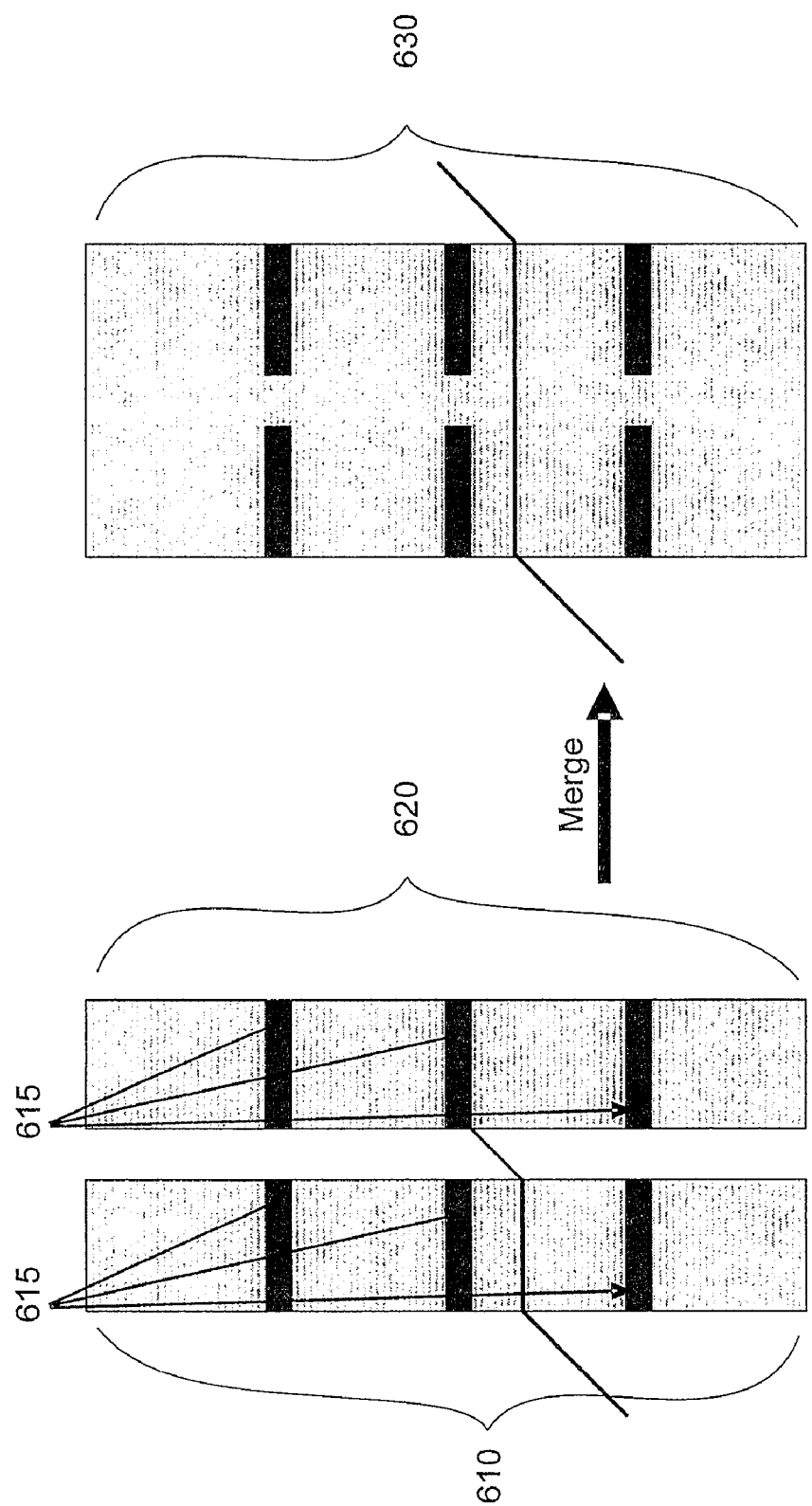
FIG. 6 illustrates merging LPD regions to encompass adjacent power stripes.

Some embodiments of the invention merge adjacent LPDRs that have the same local preferred direction to improve routability through the regions. Merging is particularly useful when individual LPDRs are defined around adjacent power stripes. For example, FIG. 6 illustrates two LPDRs 610 and 620 that are defined around two different power stripes. Both of these LPDRs have a horizontal local preferred direction. Each power stripe has a set of power via stacks 605 and 615 that may be obstacles to wiring on the layer. For example, as shown in this figure, wiring that leaves the LPDR 610 defined around one power stripe can run into a power via stack 615 of the other power stripe.

To solve this potential routing problem, FIG. 6 illustrates the merging of the two LPDRs 610 and 620 to define a new LPDR 630. The "merged" LPDR 630 is defined to encompass both power stripes and has the same horizontal local preferred direction as the replaced LPDRs 610 and 620. This merging allows the wiring to traverse efficiently across the region underneath the power stripes without the power via stack obstruction that existed when the two LPDRs 610 and 620 were separate.

This "merging" feature is not restricted for use with power stripes. Some embodiments of the invention merge adjacent LPDRs that have the same local preferred wiring direction whenever doing so would improve routing efficiency. In addition, some embodiments avoid having to merge adjacent LPDRs altogether by initially defining a single LPDR to encompass adjacent regions that require the same local preferred direction.

C. Over-Macro Traverse

Figure 7:
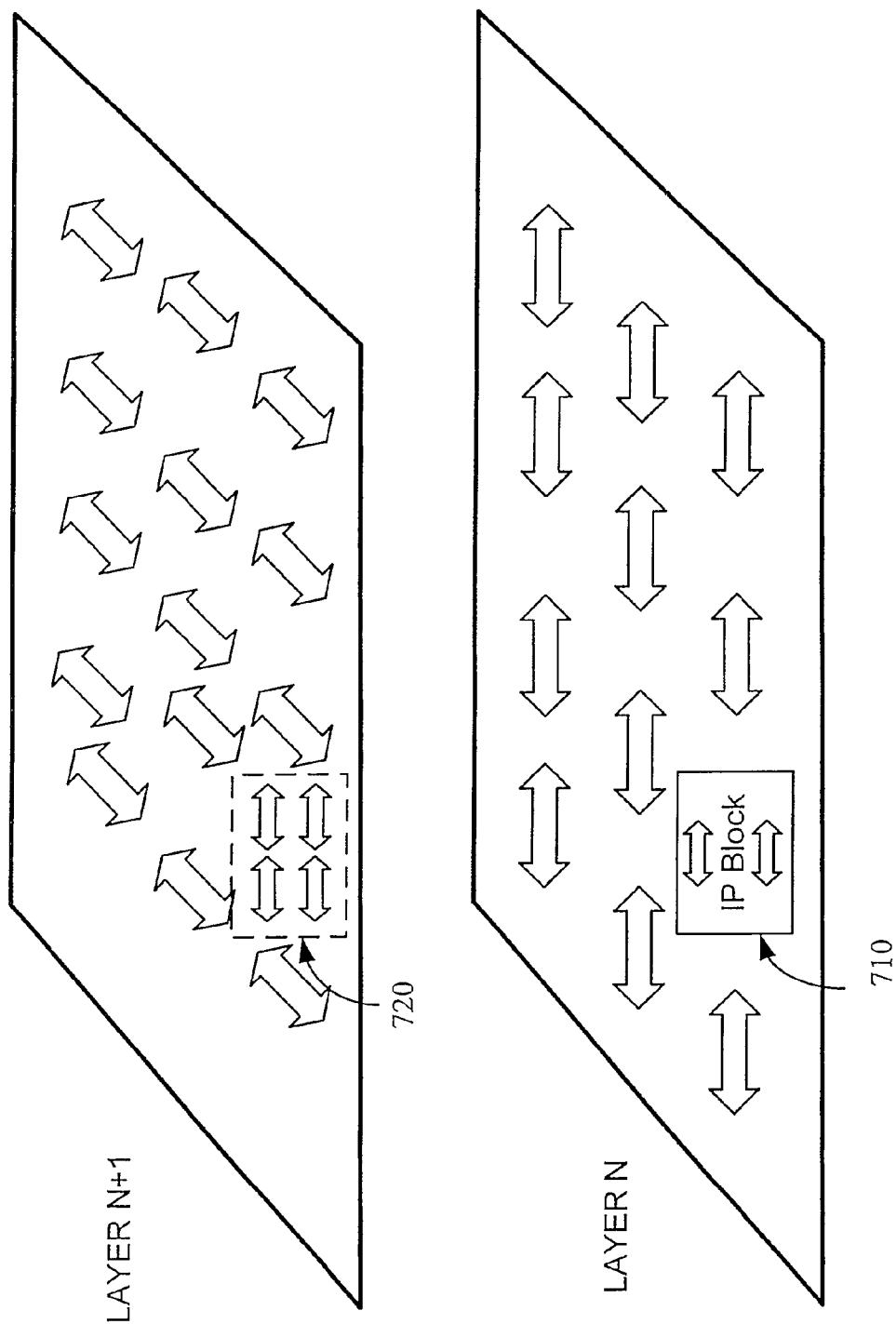
FIG. 7 illustrates defining horizontal tracks on a diagonal layer to traverse over a pre-designed circuit block.

The previous examples demonstrate the beneficial use of LPDRs on a single layer of a design layout or an IC. LPDRs are beneficial for particular multi-layer uses as well. For example, FIG. 7 illustrates a multi-layer design layout or IC that utilizes LPDRs to define horizontal tracks over a lower-layer pre-designed circuit block (e.g. an IP block). Specifically, FIG. 7 shows a Layer N that has a horizontal global preferred direction and a Layer N+1 that has a 45° global preferred direction. Layer N has a pre-designed circuit block 710 that prefers horizontal wiring. Layer N+1 has an LPDR 720 that is positioned over the pre-designed circuit block 710. This LPDR 720 has a horizontal local preferred direction in order to increase the potential locations for placing vias between the pre-designed circuit block 710 and the wiring of Layer N+1.

D. Vias That Have Differently-Shaped Via Pads

Another multi-layer use of LPDRs is in the definition of vias. Some embodiments use the LPD wiring model to dynamically define vias based on the particular design layout. Specifically, when defining a via between a first region of a first layer and a second region of a second layer, these embodiments select the shape of the via pads in the first and second regions based upon the preferred direction of both regions. This dynamic selection of the via pad shapes allows these embodiments to use vias that are optimized for connecting wire segments along different directions.

Figure 8:
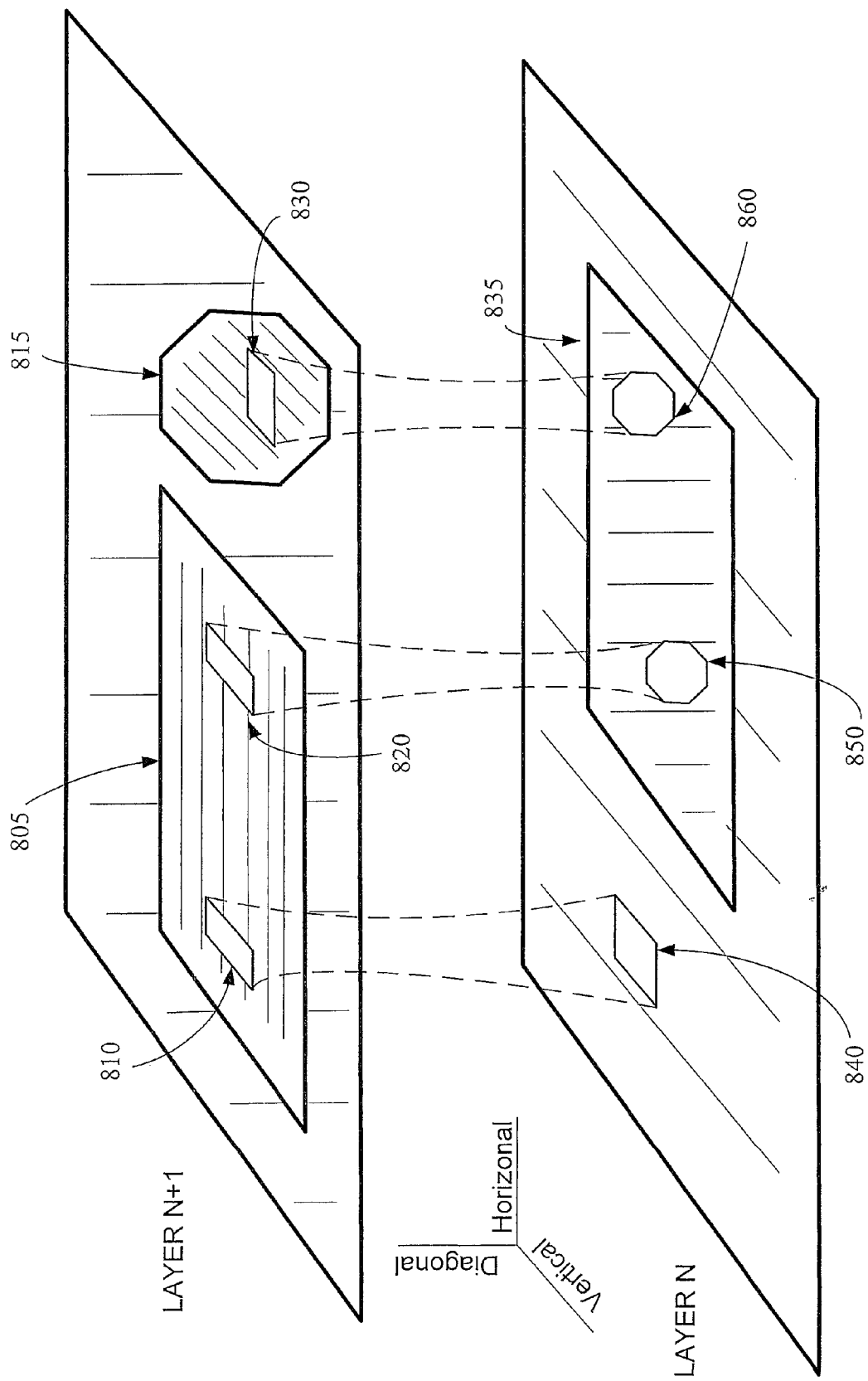
FIG. 8 illustrates vias that have different via pad shapes according to some embodiments of the invention.

FIG. 8 illustrates an example of using different via pad shapes between different regions of two wiring layers in a layout. This example illustrates a perspective view of a multi-layer design layout that has a wiring layer N with a vertical global preferred direction and a wiring layer N+1 with a diagonal global preferred direction. A directional-axis indicator is provided in FIG. 8 to identify the wiring directions according to this perspective view.

In FIG. 8, Layer N has a rectangular LPDR 835 with a diagonal local preferred direction. Layer N+1 has a rectangular LPDR 805 with a horizontal local preferred direction and an octagonal LPDR 815 with a vertical local preferred direction. This example also shows three vias between Layer N and Layer N+1. The first via is defined between the wiring area of Layer N and LPDR 805 on Layer N+1. This first via has a square via pad 840 in the wiring area of Layer N and a rectangular via pad 810 in LPDR 805. A second via is defined between LPDR 835 on Layer N and LPDR 805 on Layer N+1. This second via has an octagonal via pad 850 in LPDR region 835 and a rectangular via pad 820 in LPDR 805. A third via is defined between LPDR 835 on Layer N and LPDR 815 on Layer N+1. This third via has an octagonal via pad 860 in LPDR 835 and a rectangular via pad 830 in LPDR 815.

The example above suggests just one of many combinations of via-pad-pairs between Layers N and N+1. Furthermore, there are a multitude of other LPDR configurations that can be used when designing a multi-layer IC. Accordingly, some embodiments of the invention tabulate the possible permutations of via-pad pairs to account for these variations in design layout configurations. This tabulation provides a user with via pad options when optimizing vias between regions that have different local preferred directions.

III. Graphical User Interface

Some embodiments of the invention provide a GUI to allow the user to view an LPD layout and/or create and manipulate LPDRs on a layout. The GUI of some embodiments (1) saves/loads/deletes LPDRs, (2) displays current LPDRs with their preferred directions and highlighted impermeable edges, (3) adds/manipulates the shapes of LPDRs and their respective local preferred directions, (4) snaps adjacent LPD regions to remove unwanted gaps, and (5) runs a consistency checker that highlights overlaps and degenerate regions of a design layout. In other embodiments, the GUI incorporates an Auto-LPD Region Generator that defines LPDRs to increase a design's routing resources, without forcing the user to create LPR regions manually.

The GUI's visual representation of a LPD design layout according to some embodiments of the invention is first described below. This discussion is then followed by a discussion of the GUI's creation and manipulation of LPDRs according to some embodiments of the invention.

A. Visual Representation of an LPD Design Layout

Figure 9:
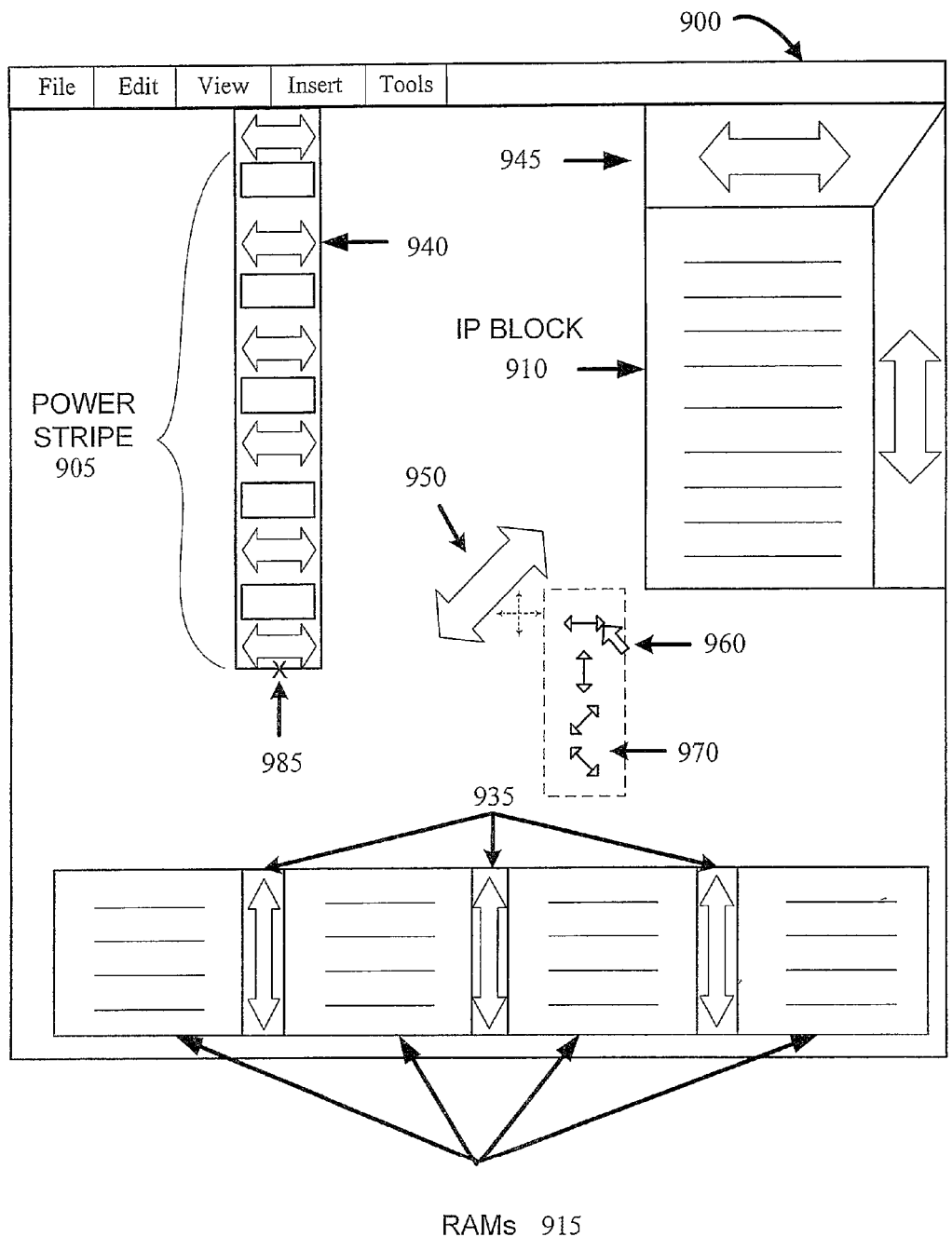
FIG. 9 illustrates a visual representation of a design layout using the Graphical User Interface according to some embodiments of the invention.

An LPD design layout typically consists of pre-designed circuit blocks, LPDRs, pins, wiring, and other layout elements. FIG. 9 presents a GUI of some embodiments of the invention for graphically presenting these elements in a design layout. This figure illustrates a design window 900 that represents a third wiring layer that has a diagonal global preferred direction. Within this design window 900 are three pre-designed circuit blocks: a power stripe 905, an IP block 910, and a set of RAMS 915. At the top of design window 900, is a list of "drop-down menus" that provide a user with access to some of the features of the GUI itemized above, such as loading, deleting, and creating layouts with LPDRs. In this example, there are menus for "File", "Edit", "View", "Insert", and "Tools". Other embodiments however provide different and/or additional menus.

A user can access menu options by performing a "clicking" operation while a cursor is over the desired menu choice. Another way for a user to access GUI menus is to perform a "right-clicking" operation while a cursor is within the design window. For example, FIG. 9 illustrates a user accessing a "preferred direction menu" 970 by performing a "right-clicking" operation while a cursor 960 is within design window 900.

FIG. 9 also illustrates four LPDRS. Two of these LPDRs 930 and 935 have vertical local preferred directions. The other two LPDRs 940 and 945 have horizontal local preferred directions. As this example illustrates, the GUI uses "directions arrows" to identify the preferred directions of any LPDRs in the design layout. The GUI also uses direction arrows to identify the preferred direction of the wiring layer in the design window. For example, direction arrow 950 identifies the diagonal global preferred direction of the wiring layer in design window 900.

In addition to identifying the preferred directions of LPDRs in the design window, the GUI in some embodiments identifies any impermeable edges of the LPDRs. Impermeable edges are identified by (1) placing an identifier (e.g. graphical or textual icon such as an "X") on the edge, or by (2) changing the attribute of the edge (dash, color, etc). In this example, an "X" icon 985 is superimposed on an impermeable boundary edge of LPDR 940. Identification of impermeable edges alerts the user to make changes to the layout to improve routabililty through the respective boundary edges (i.e., by adding "crowns").

The GUI design window 900 not only provides a visual representation of the design elements on an "active" wiring layer (the layer currently viewed by the user), but some embodiments identify design elements on other wiring layers. To distinguish these "other layer" design elements from the design elements on the active layer, the GUI provides differing visual representations of these "other layer" design elements. For instance, some embodiments use different coloring, shape, fill patterns, or boundary-line dashing to identify design elements that are on a layer other than the active layer.

Figure 10:
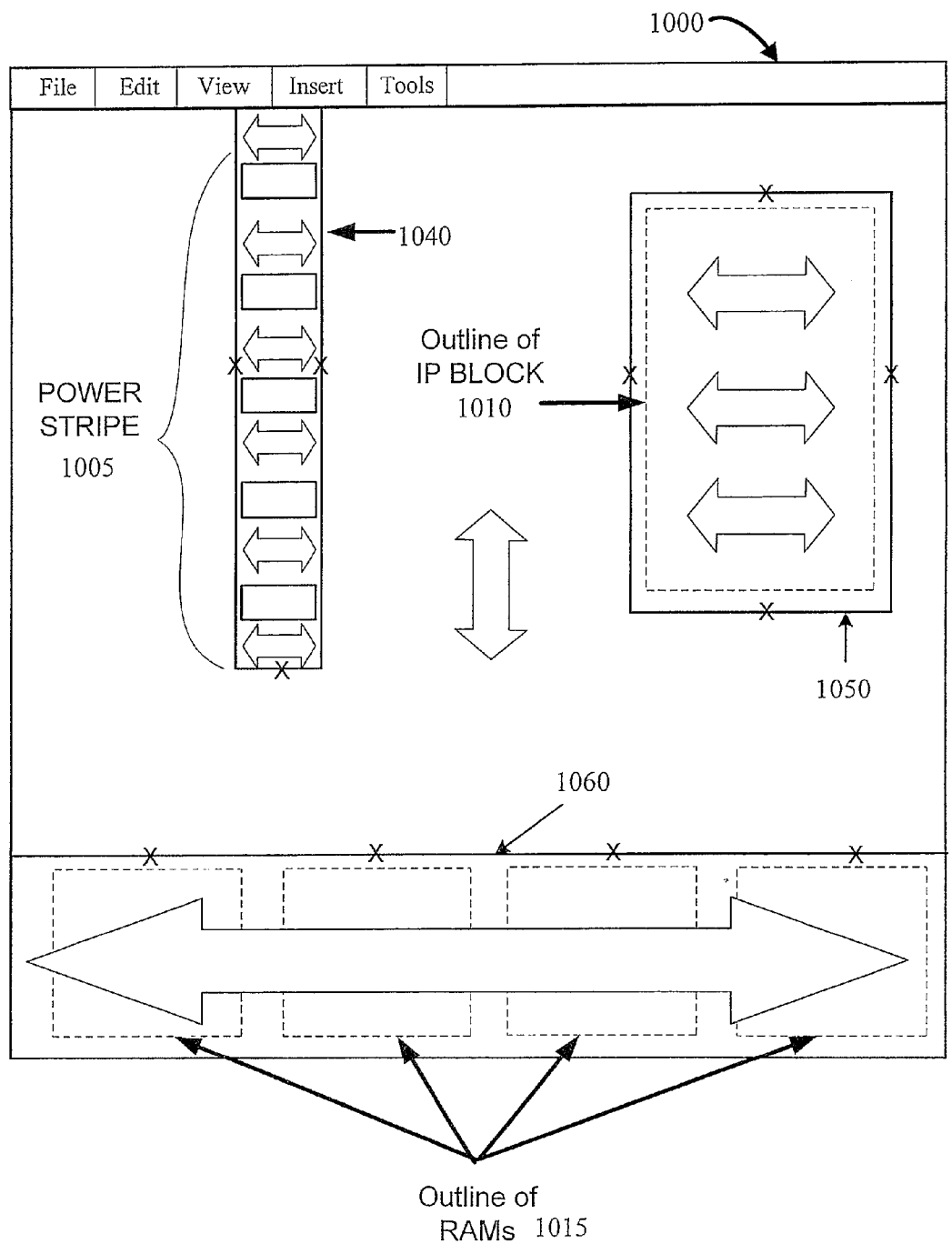
FIG. 10 illustrates the indication of LPD regions that overlap pre-designed circuit blocks on a lower layer in a design window of a Graphical User Interface according to some embodiments of the invention.

FIG. 10 illustrates an example of the visual representation of "other layer" design elements according to some embodiments of the GUI. Specifically, FIG. 10 illustrates a design window 1000 representing a fourth wiring layer that has a vertical global preferred direction. This fourth wiring layer is above the third wiring layer previously illustrated in FIG. 9. As shown in design window 1000, the pre-designed circuit blocks on the lower third layer are represented by "dashed outlines" 1010 and 1015. The outlines are "dashed" for illustrative purposes in this example only, as most embodiments of the invention typically use different colored regions to represent other-layer pre-designed circuit blocks.

In this example, the "outlines" represent the relative location of IP block 910 and RAMS 915 on the lower third wiring layer. The outlining of lower-level pre-defined circuit blocks enables a user to accurately define LPDRs on an active layer to overlap the pre-defined circuit blocks. For example, LPDRs 1050 and 1060 are defined in design window 1000 to overlap the pre-designed circuit blocks on the lower layer. The benefits of defining LPDRs to overlap pre-defined circuit blocks on a lower level were previously discussed in Section II. C.

B. LPD Region Creation and Manipulation

The GUI's creation and manipulation of LPDRs according to some embodiments of the invention is first described below. This discussion is then followed by a discussion of alternate methods of creating and manipulating LPDRs according to other embodiments of the invention.

1. LPDR creation and manipulation

Figure 11A:
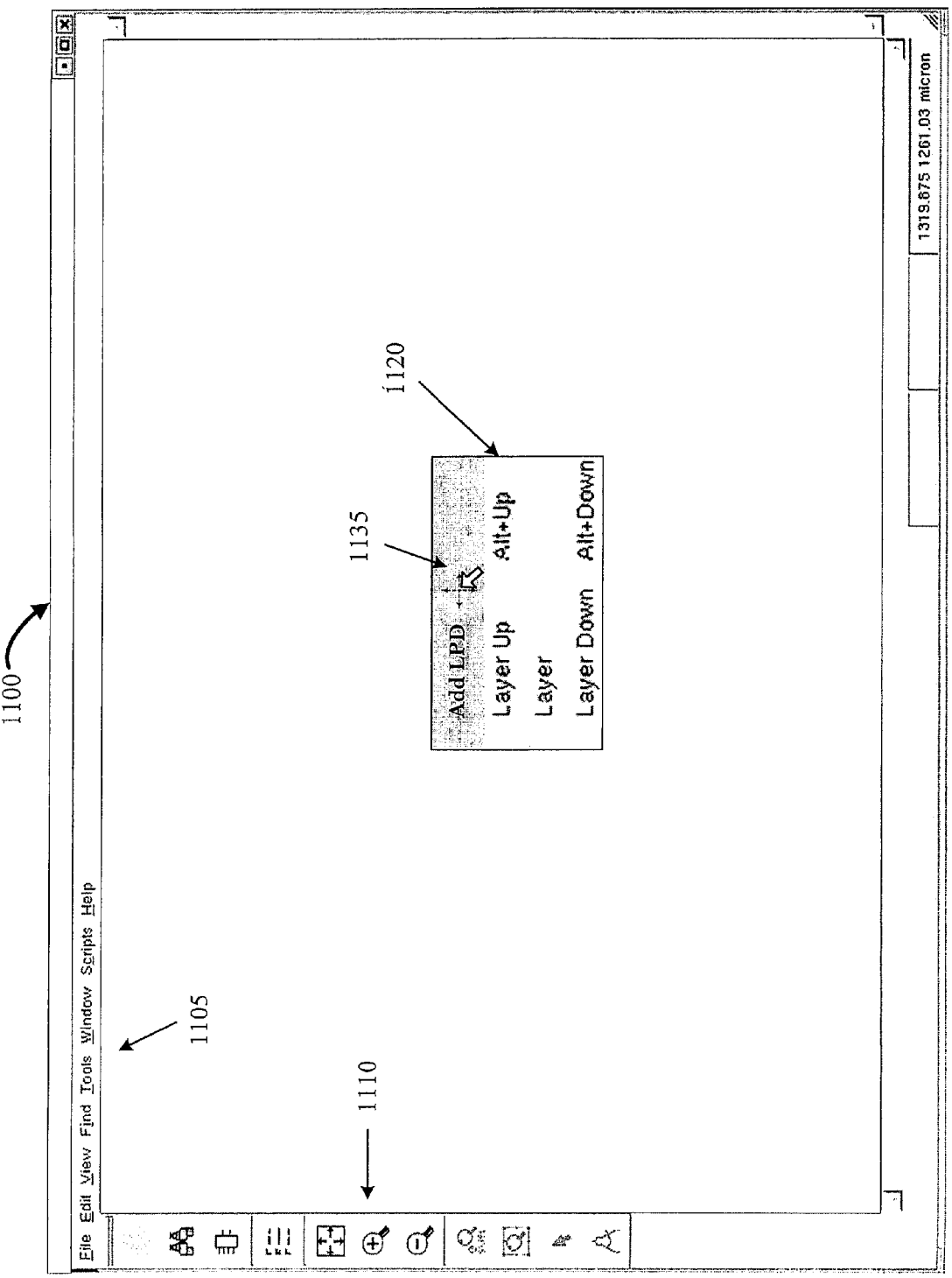
FIGS. 11A-11D illustrate a user creating an LPD region using an "LPDR Creation Tool" in a design window of the Graphical User Interface according to some embodiments of the invention.

The GUI provides a user with precise tools to create and manipulate an LPD design layout. For example, FIGS. 11A-11E illustrate the creation of LPDRs using an "LPDR Creation Tool". Specifically, FIG. 11A illustrates a design window 1100 that has a Menu Bar 1105 and a Tool Bar 1110. The Menu Bar 1105 contains a few different menus than previously discussed above in Section III. A. The Tool Bar 1110 contains a few "docked" menu items that are used frequently when designing layouts. These include, among other things, a search tool, a zoom tool, and an "insert Macro" tool.

Figure 11B:
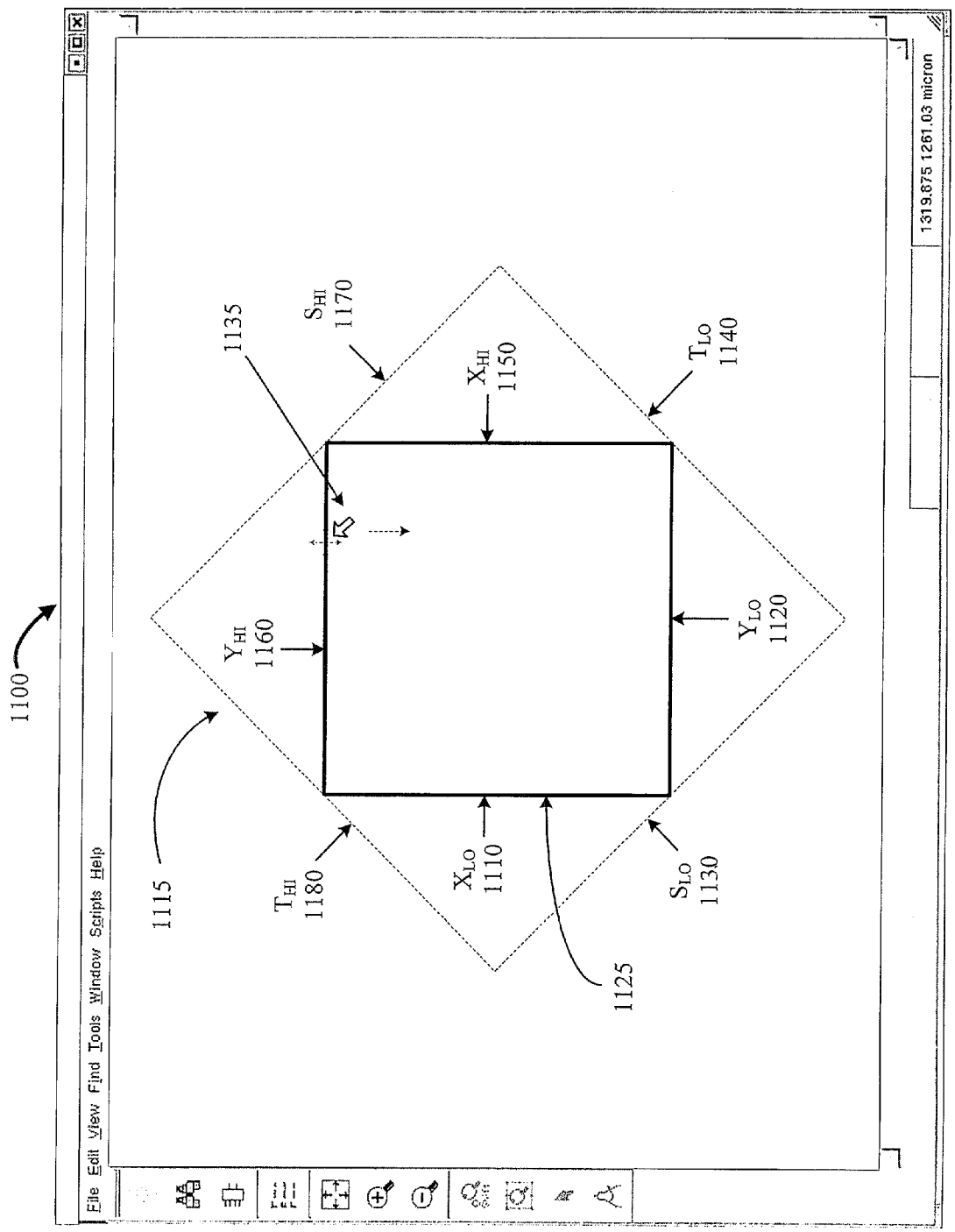

In order to create an LPDR, a user would first have to access an "LPR menu-window". Typically, a user opens this LPDR menu window by performing a "right-clicking" operation with a pointing device as previously discussed above with reference to FIG. 9. However, the GUI can be configured to open the menu window via other input methods. Additionally, the user can open the LPDR menu window by navigating through specific options in the menu bar. In this example, a user opens an "LPDR menu window" 1120 and selects an "Add LPD" option with a cursor 1135. This prompts the GUI to display an "LPDR creation tool" 1115 within the design window 1100 as illustrated in FIG. 11B. This "LPDR creation tool" is particularly useful in designing LPDR octangles, which are LPDRs in the shape of an octagon. However, the LPDR creation tool can be used to create LPDRs in the shape of other geometries as well.

An octangle in some embodiments is a data structure that is useful for design layouts that have items with horizontal, vertical, and/or ±45° directions. Specifically, in these embodiments, an octangle represents a convex geometric shape in terms of eight values, $x_{LO}$, $y_{LO}$, $s_{LO}$, $t_{LO}$, $x_{HI}$, $y_{HI}$, $s_{HI}$, and $t_{HI}$. These eight values define eight half-planes in two coordinate systems, where one coordinate system is a Manhattan coordinate system that is formed by an x-axis and a y-axis, and the other coordinate system is a 45'-rotated coordinate system that is formed by an s-axis and a t-axis. The s-axis is at a 45° counter-clockwise rotation from the x-axis, while the t-axis is at a 45° clockwise rotation from the x-axis. In the layouts of some embodiments, horizontal lines are aligned with the x-axis, vertical lines are aligned with the y-axis, 45° diagonal lines are aligned with the s-axis, and −45° diagonal lines are aligned with the t-axis.

Octangles are further described in U.S. patent application Ser. No. 10/443,595, entitled "Method and Apparatus for Representing Items in a Design Layout," which published as U.S. Published Patent Application 2004-0225983A1. This patent application is incorporated herein by reference. In the description below, both the wiring and non-wiring geometries of the design layout are convex shapes, or can be decomposed into convex shapes, that have horizontal, vertical, and ±45° sides. One of ordinary skill will realize, however, that some embodiments might use the octangle data structure in cases where the wiring or non-wiring geometries are more restricted.

FIG. 11B illustrates an LPDR Creation Tool 1115 that has eight half-planes; $x_{LO}$ 1110, $y_{LO}$ 1120, $s_{LO}$ 1130, $t_{LO}$ 1140, $x_{HI}$ 1150, $y_{HI}$ 1160, $s_{HI}$ 1170, and $t_{HI}$ 1180. The four s and t half-planes initially form a square that circumscribes a square formed by the four x and y half planes. However, all eight of these half-planes are user selectable and can be moved to create LPDRs that have various polygonal shapes. The shape of a proposed LPDR is defined as the closed surface formed by the inner-most portions of the half-planes. For example, FIG. 1B shows a proposed LPDR 1125 shaped like a square as defined by the half-planes $x_{LO}$ 1110, $y_{LO}$ 1120, $x_{HI}$ 1150, and $y_{HI}$ 1160 of LPDR Creation Tool 1115. In this example, the inner-most portions of the half-planes are the entire half-planes $x_{LO}$ 1110, $y_{LO}$ 1120, $x_{HI}$ 1150, and $y_{HI}$ 1160. All the portions of the remaining half planes, $s_{LO}$ 1130, $t_{LO}$ 1140, $s_{HI}$ 1170, and $t_{HI}$ 1180 are on the exterior of the default LPDR Creation Tool 1115. To aid in distinguishing the inner and exterior portions of half-planes, some embodiments of the invention use bolded solid-lines to represent the inner-most portions and dashed-lines to represent the exterior portions of the half-planes.

Figure 11C:
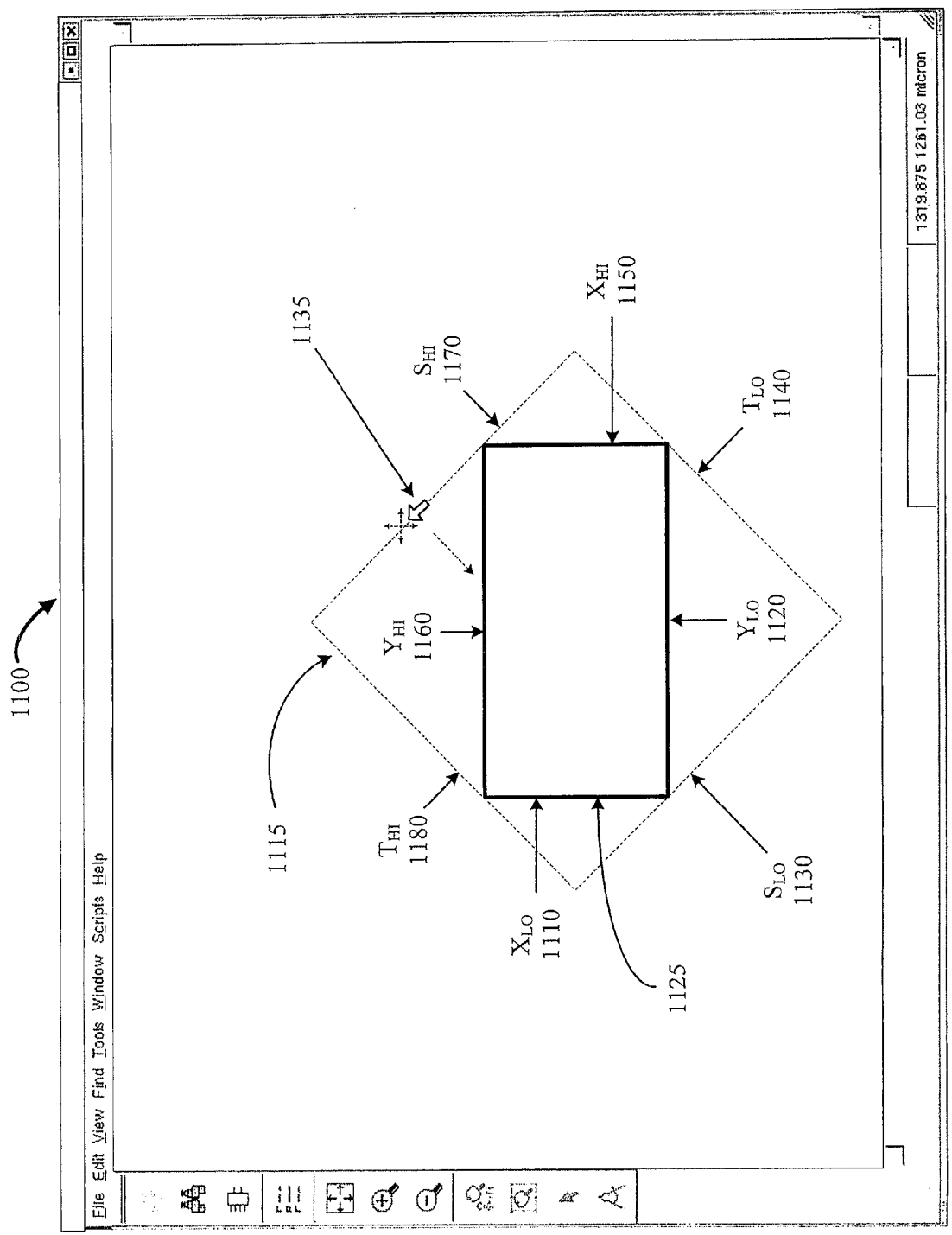

As mentioned above, the half-planes are user-selectable and can be moved to define the shape of a proposed LPDR. FIG. 11B illustrates a user selecting half plane $y_{HI}$ 1160 with a cursor 1135 and moving it downward. As a result, the proposed LPDR 1125 is re-defined to form a rectangle as shown in FIG. 11C. This figure also illustrates that the exterior half-planes, $s_{LO}$ 1130, $t_{LO}$ 1140, $s_{HI}$ 1170, and $t_{HI}$ 1180 are redefined to maintain the form of a square that circumscribes the proposed LPDR 1125. The exterior half-planes maintain the form of a circumscribing square until they are moved inward. This inward movement of an exterior half-plane is also illustrated in FIG. 11C by a user selecting half plane $s_{HI}$ 1170 with the cursor 1135 and moving it inward. The resulting re-definition of the proposed LPDR 1125 is illustrated in FIG. 11D.

Figure 11D:
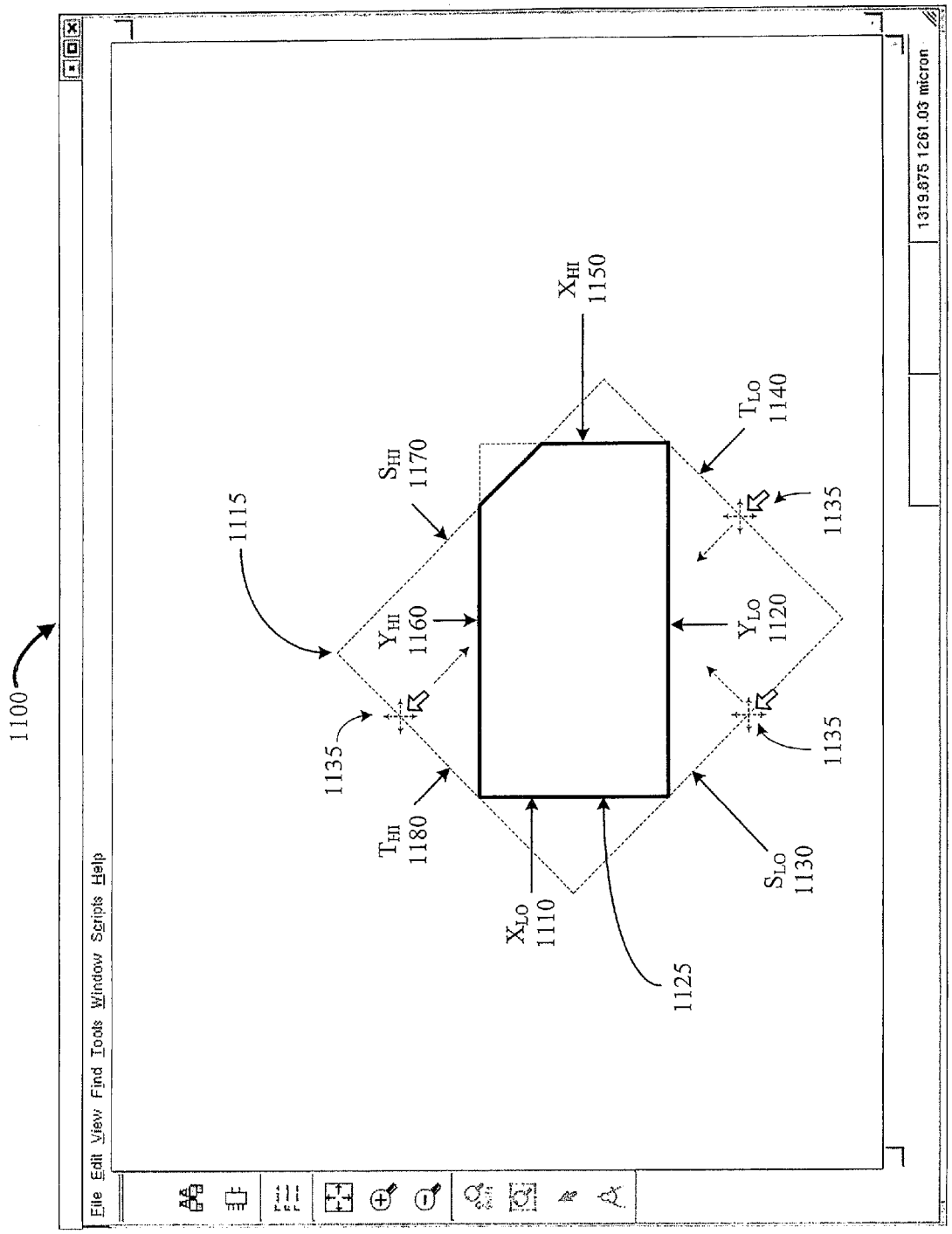

FIG. 11D shows the proposed LPDR 1125 in the shape of a 5-sided polygon formed by the interior portions of half-planes $x_{LO}$, 1110, $y_{LO}$ 1120, $x_{HI}$ 1150, $s_{HI}$ 1170 and $y_{HI}$ 1160. The interior portion of $s_{HI}$ 1170 and the exterior portions of $x_{HI}$ 1150 and $y_{HI}$ 1160 are represented by the appropriate bolded solid-lines and dashed lines respectively. FIG. 11D also illustrates a user selecting half-planes $s_{LO}$ 1130, $t_{LO}$ 1140, and $t_{HI}$ 1180 with the cursor 1135 and moving them inward. The resulting re-definition of the proposed LPDR 1125 is illustrated in FIG. 11E.

Figure 11E:
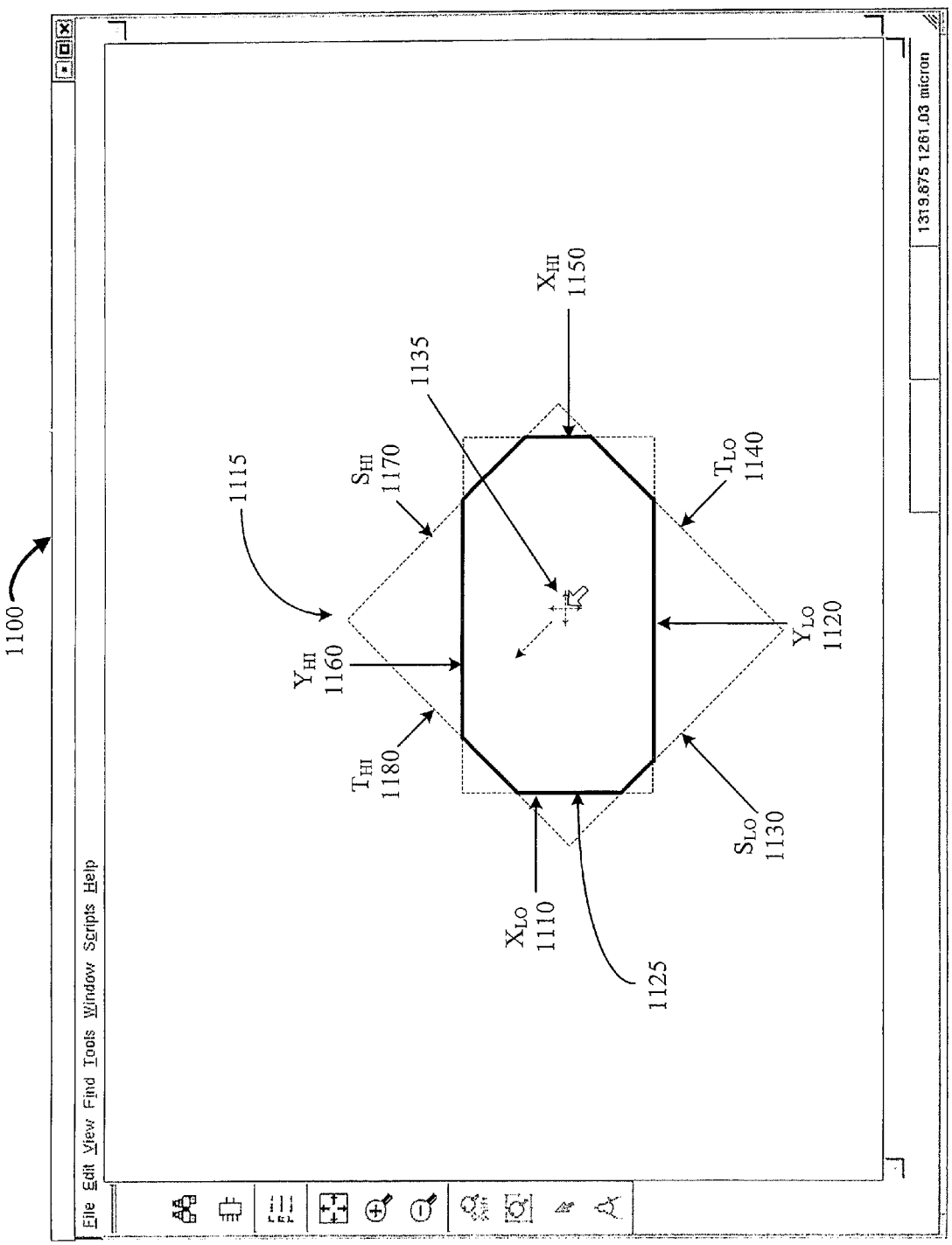
FIGS. 11E and 11F illustrate a user moving an LPD region within a design window of the Graphical User Interface according to some embodiments of the invention.

FIG. 11E shows the proposed LPDR 1125 in the shape of an irregular octagon, i.e., an octagon that has sides with unequal length. This is a result of the independent and divergent movement of the half-planes when forming the proposed LPDR 1125. This independent half-plane movement affords a user the flexibility to create unique LPDRs that have shapes that are precisely defined for a particular design layout. However, some embodiments of the invention allow a user to "lock" the aspect ratio between any two or more half-planes. As such, movement of a "locked" half-plane will also move any other "locked" half-planes by an amount proportional to their respective aspect ratios. This "locking" feature provides a user with further flexibility in defining LPDRs.

Once an LPDR is created in the design window, the GUI in some embodiments presents a user with features to manipulate the attributes of an LPDR. Some of these features include (1) resizing the LPDR, (2) moving the LPDR, (3) assigning/modifying the LPDR's local preferred direction, (4) changing the LPDR's layer designation, and (5) duplicating the LPDR. The resizing and moving features are typically implemented by "select and drag" operations with a cursor. However, the remaining features are typically implemented by selecting the particular option in an LPDR Modification Menu. These modification features of the GUI according to some embodiments of the invention will be described more thoroughly below.

To resize an LPDR, a user would move a particular half-plane as described above with reference to FIGS. 11B-11D. This is performed by "selecting and dragging" a particular half-plane to a desired location within the design window. Also, as mentioned above, the user has the option to "lock" the aspect ratio between any two or more half plane pairs when resizing LPDRs.

Figure 11F:
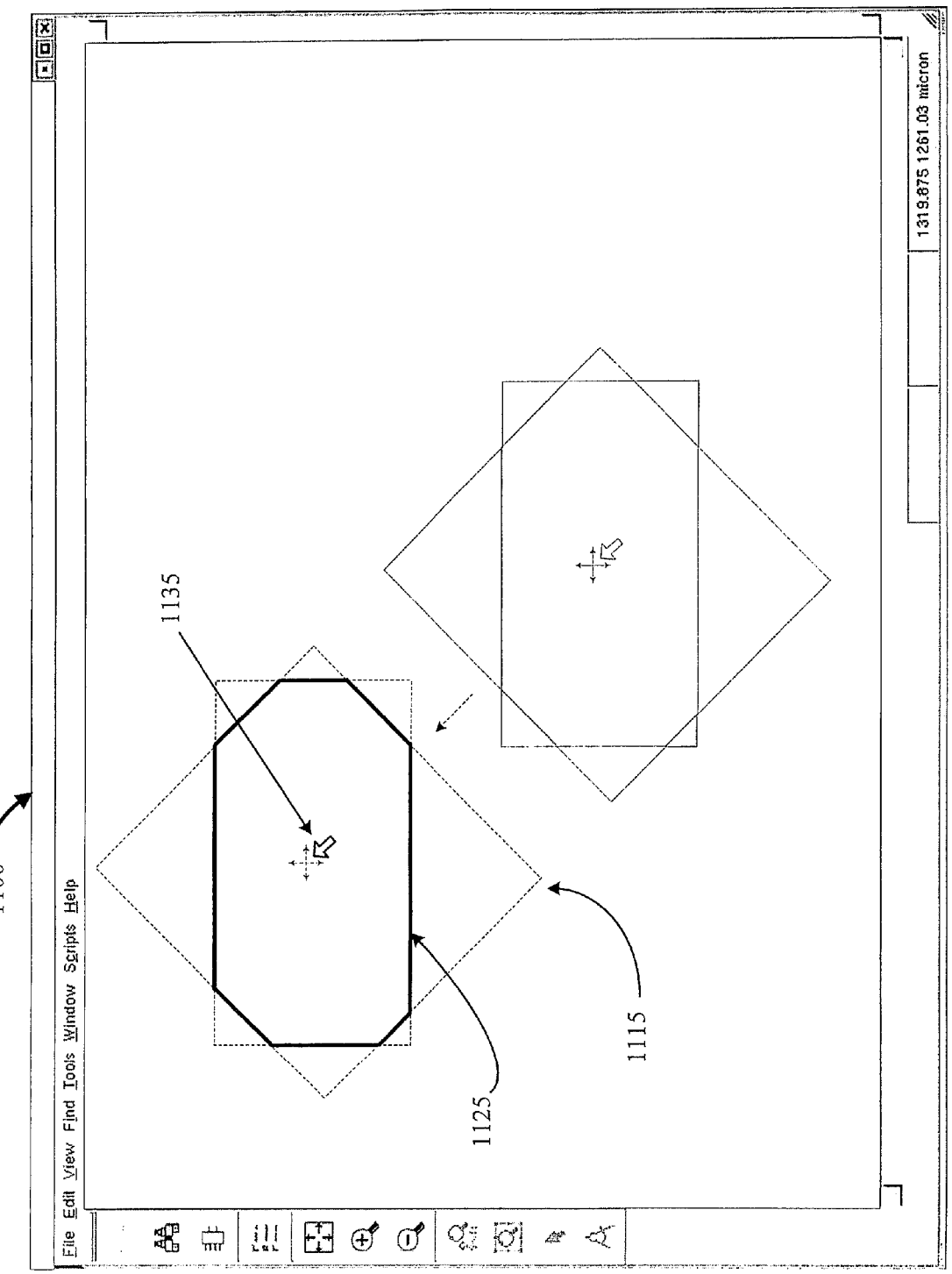

To move an LPDR, the user would place a cursor over the surface of a particular LPDR and perform a "select and drag" operation along a desired direction. FIGS. 11E and 11F illustrate a user moving the LPDR 1125 created in the previous example. Specifically, FIG. 11E illustrates a user placing a cursor 1135 over the surface of LPDR 1125 and moving it diagonally up and to the left in design window 1100. As a result, LPDR 1125 is moved to an appropriate location within design window 1100 as shown in FIG. 11F.

Figure 12A:
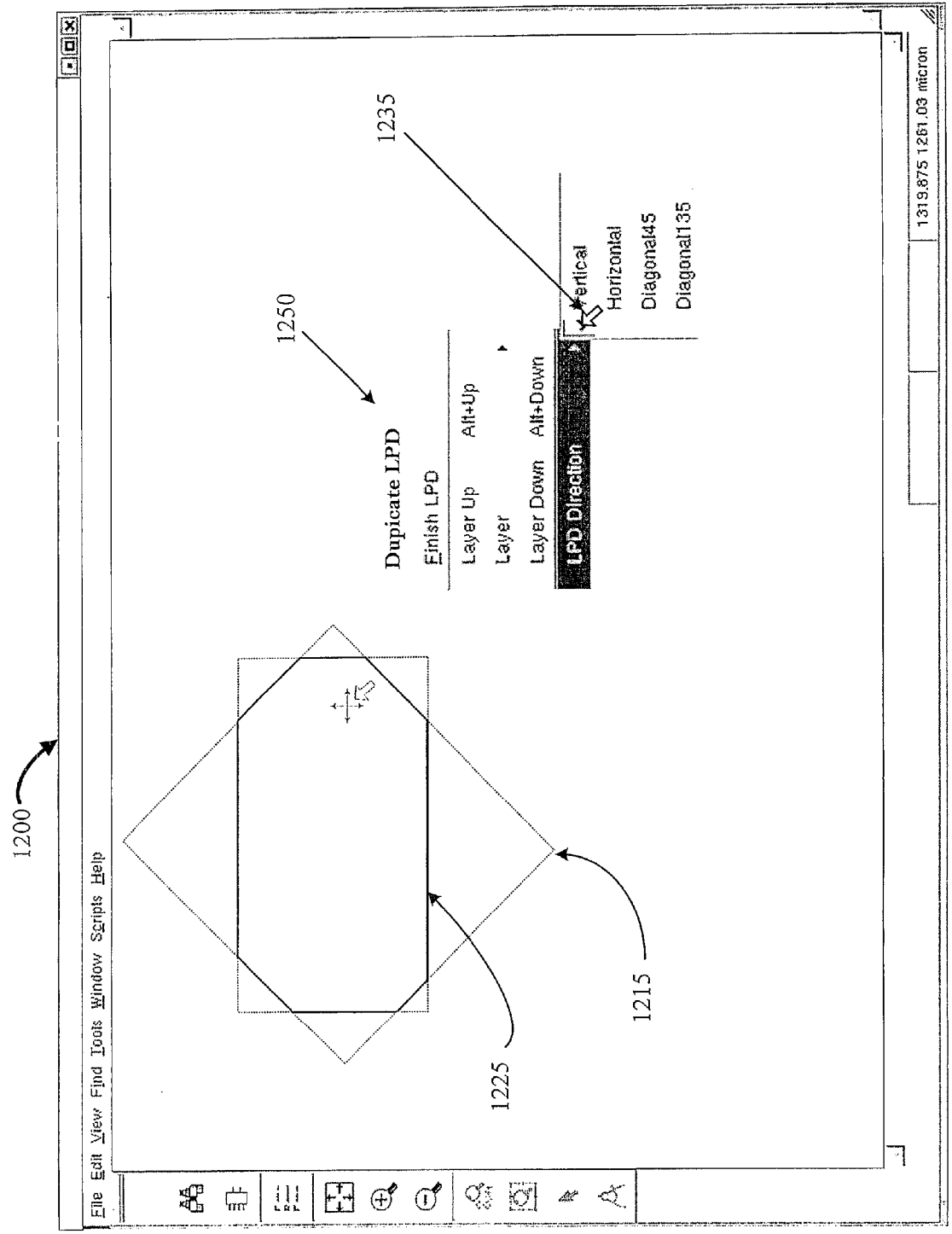
FIGS. 12A and 12B illustrate a user specifying a local preferred direction for an LPD region in a design window of the Graphical User Interface according to some embodiments of the invention.
Figure 12B:
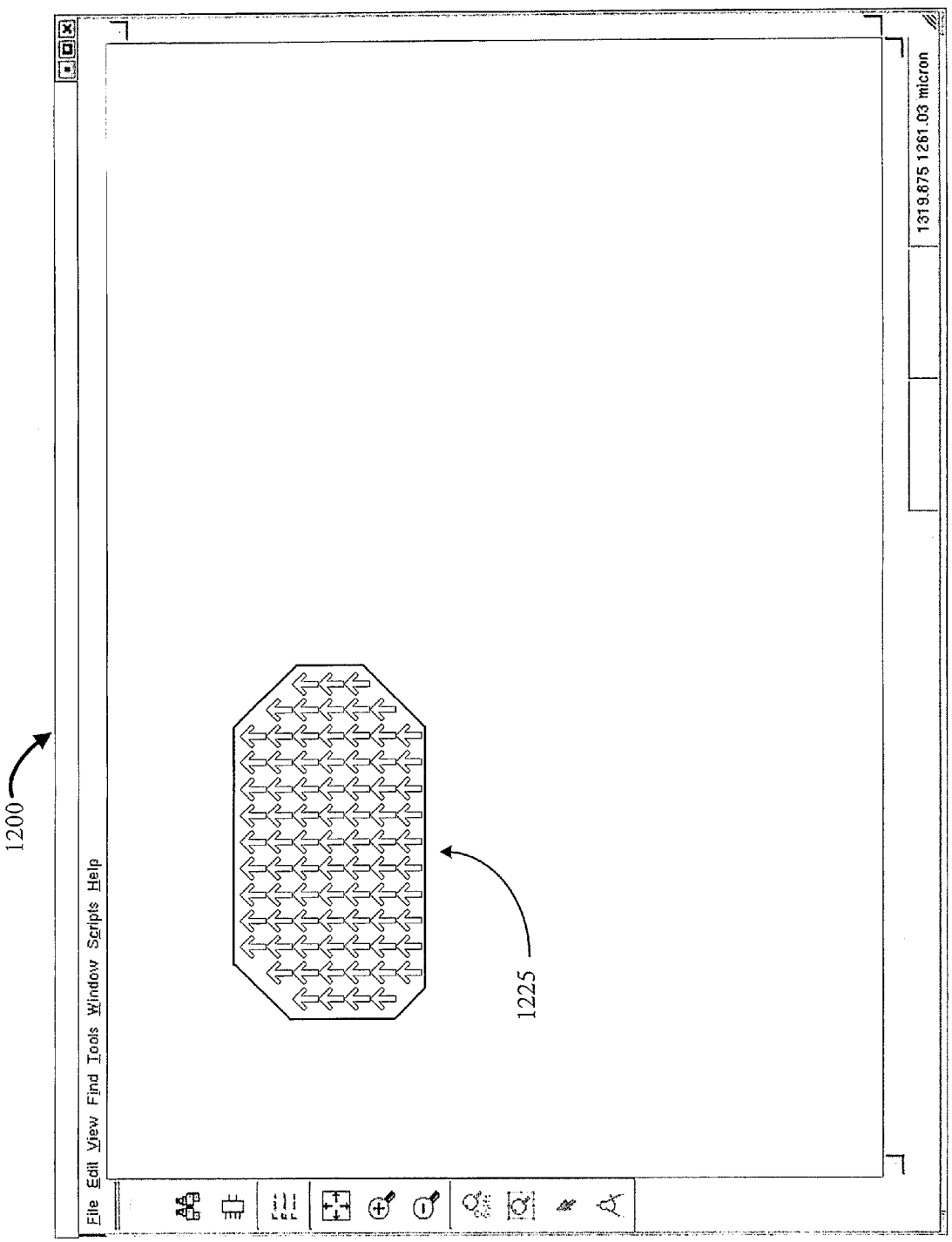

To assign/modify the LPDR's local preferred direction, change the LPDR's layer designation, and/or duplicate the LPDR, the user would access an LPDR Modification Menu as illustrated in FIG. 12A. In this figure, a user opens an LPDR Modification Menu 1250 by placing a cursor 1235 over LPDR 1225 an performing a "right click" operation. This LPDR Modification Menu 1250 provides various menu options such as Duplicate LPD, Finish LPD, Layer UP/Down, and LPD Direction. These menu option are "expandable" in some embodiments of the invention, meaning that selecting a particular menu option will expand the menu to provide further options. In this example, a user selects and expands the LPD Direction menu option, and then selects a "Vertical" local preferred direction for LPDR 1225. As a result, some embodiments of the invention place vertical direction arrows within LPDR 1225 as illustrated in FIG. 12B.

Some embodiments of the invention assign a "default" local preferred direction for an LPDR when it is first created. The default local preferred direction to be assigned can be previously specified by the user. Nevertheless, in cases where an LPDR was assigned a default local preferred direction, the user can modify any LPDR's local preferred direction by using the same method as described above for assigning the LPD.

To change the LPDR's layer designation, the user would select the particular option from the LPDR Modification Menu. For example, the user can move a particular LPDR up or down a layer by selecting the "Layer Up" or "Layer Down" option in the LPDR Modification Menu 1250 previously referred to in FIG. 12A. In addition, the user can also move an LPDR to any specific layer by selecting the expandable "Layer" option provided in the LPDR Modification Menu. As a result, the GUI in some embodiments of the invention will change the coloring of the LPDR to indicate a specific layer designation.

A user can also duplicate an LPDR by selecting the Duplicate LPD option in the LPDR Modification Menu. Doing so will prompt the GUI to create an LPDR in the design window that has the same attributes as the LPDR selected for duplication (i.e. same shape, local preferred direction, and layer designation). As previously discussed, the LPDR Modification Menu also provides a "Finish LPD" option. This option allows a user to finalize the creation/definition of an LPDR. As a result, some embodiments of the invention remove the half-planes of the LPDR Creation Tool so that the particular LPDR cannot be inadvertently resized. Other embodiments of the invention also "freeze" the LPDR in its particular location in the design layout so that the particular LPDR cannot be inadvertently moved. However, other embodiments of the invention still allow a user to modify the attributes of a "finalized" LPDR. An example of a "finalized" LPDR 1225 with the LPDR Creation Tool removed is illustrated in FIG. 12B.

2. Alternate Methods of LPDR Creation and Manipulation

The creation and manipulation of LPDR using the GUI of some embodiments of the invention was discussed above. However, these aforementioned embodiments presented only a few of the many ways to create and modify an LPDR using the GUI of the present invention. Various other methods of other embodiments of the invention are described below. In addition, another feature of the GUI called "crowning" will be introduced.

Figure 13A:
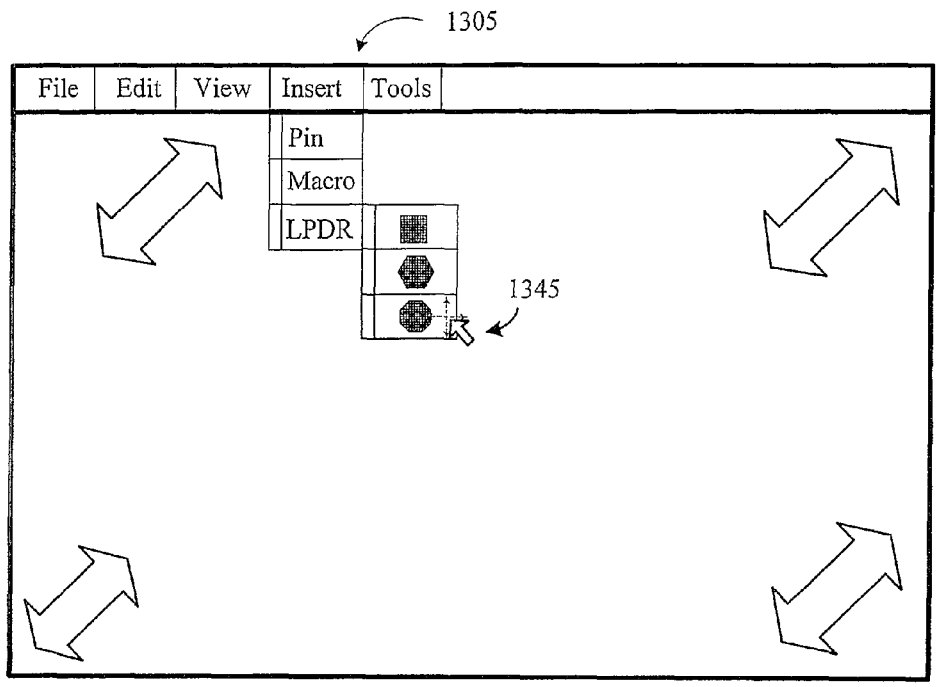
FIGS. 13A and 13B illustrate a user creating an LPD region using a "select and drop" method in a design window of the Graphical User Interface according to some embodiments of the invention.
Figure 13B:
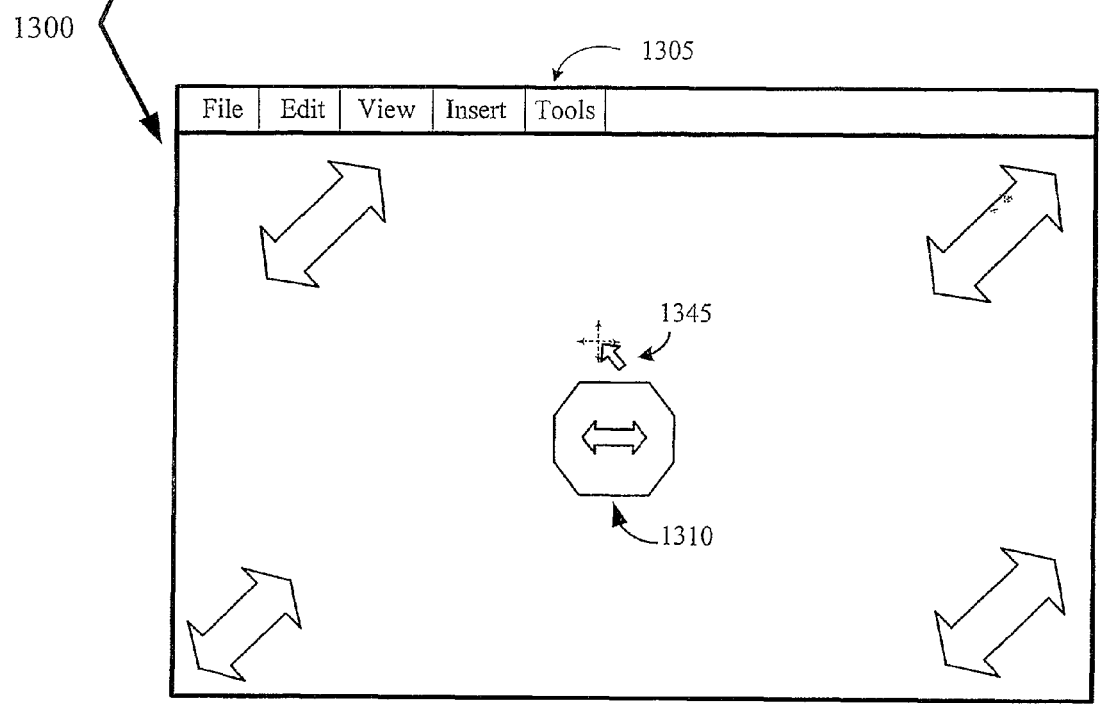

FIGS. 13A and 13B illustrate how the GUI according to some embodiments of the invention enables a user to create LPDRs. These figures illustrate a design window 1300 that represents a wiring layer that has a diagonal global preferred direction. Specifically, FIG. 13A shows a user accessing an "Insert" drop down menu with a cursor 1345 and selecting an LPDR shape. As a result, an octagonal LPDR 1310 that has a horizontal local preferred direction is dropped into the design window 1300 as shown in FIG. 13B. In this example, a default size and a default horizontal local preferred direction was specified for LPDR 1310. Other embodiments specify different default sizes and local preferred directions for LPDRs that are dropped into the design window. Nevertheless, both these attributes of an LPDR can be manipulated as will be described further below.

Figure 13C:
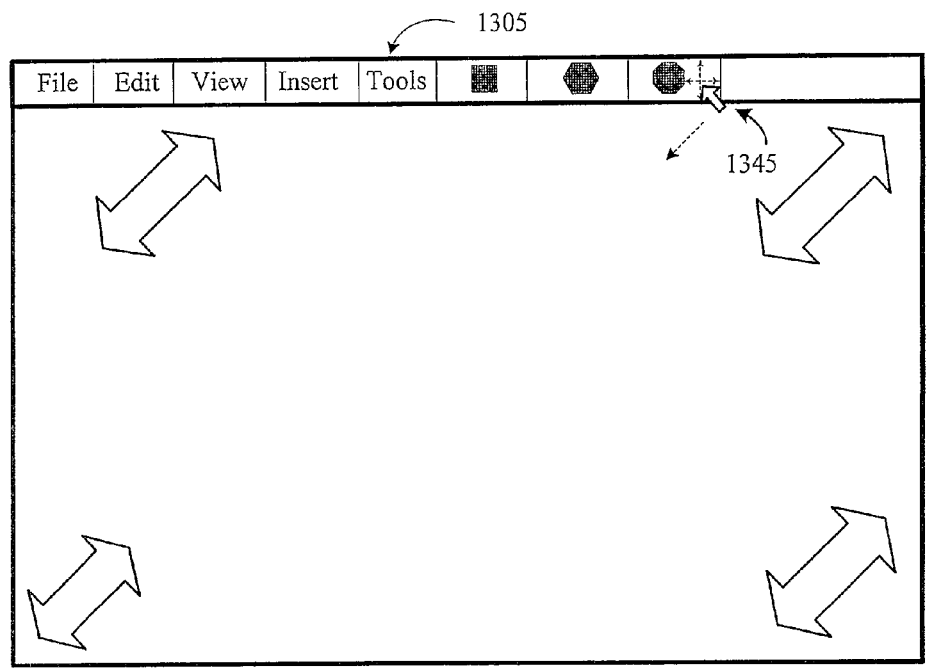
FIGS. 13C and 13D illustrate a user creating an LPD region using a "select and drag" method in a design window of the Graphical User Interface according to some embodiments of the invention.
Figure 13D:
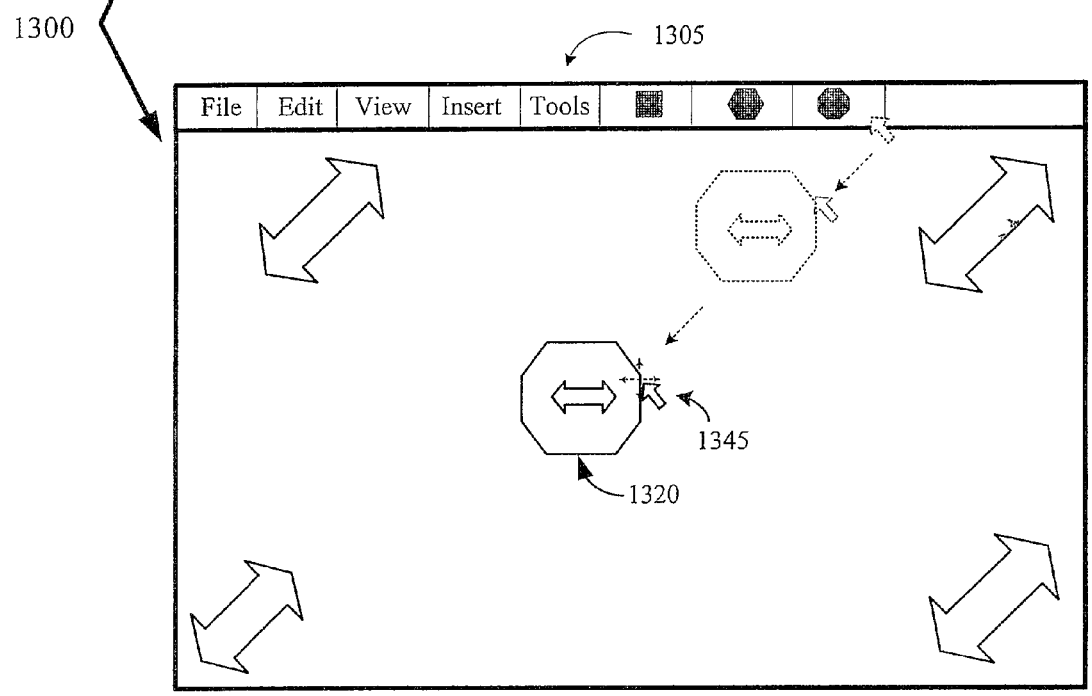

A user can also create LPDRs according to other embodiments of the invention by selecting and dragging a desired LPDR shape into the design window. The GUI can be configured to "dock" any menu options within a drop down menu onto the "menu bar". As such, the LPDR shapes provided within the "Insert LPD" menu can be displayed along the menu bar as illustrated in FIGS. 13C and 13D. Specifically, these figures also show a design window 1300 that has various LPDR-shapes "docked" onto the menu bar 1305. In this example, a user places the cursor 1345 over the octagonal LPDR-shape, then "selects and drags" the shape into the design window. As a result, an octagonal-shaped LPDR 1320 is created in design window 1300.

Figure 13E:
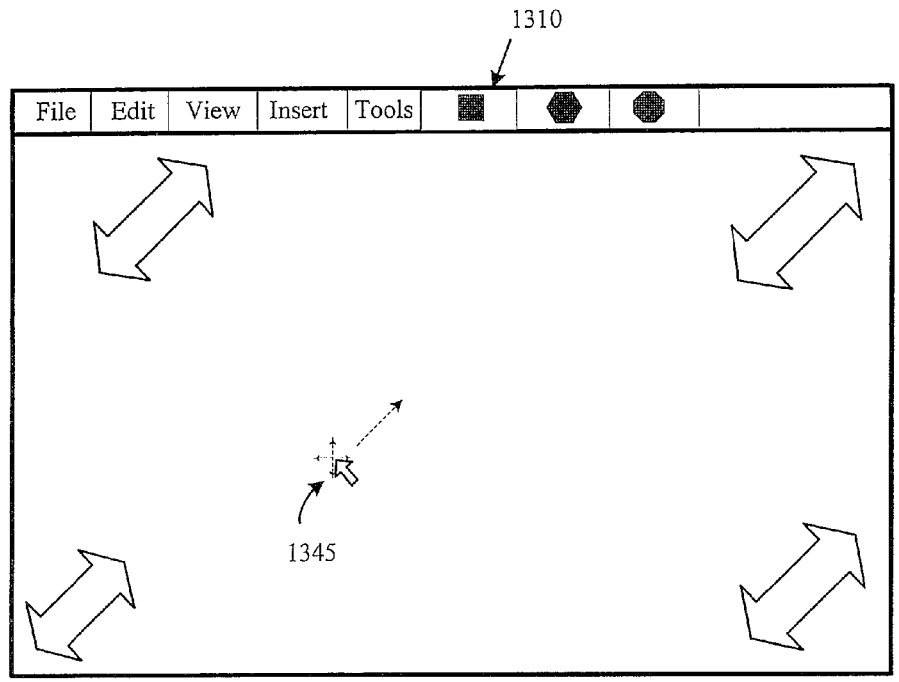
FIGS. 13E and 13F illustrate a user creating an LPD region using a "select and expand" method in a design window of the Graphical User Interface according to some embodiments of the invention.
Figure 13F:
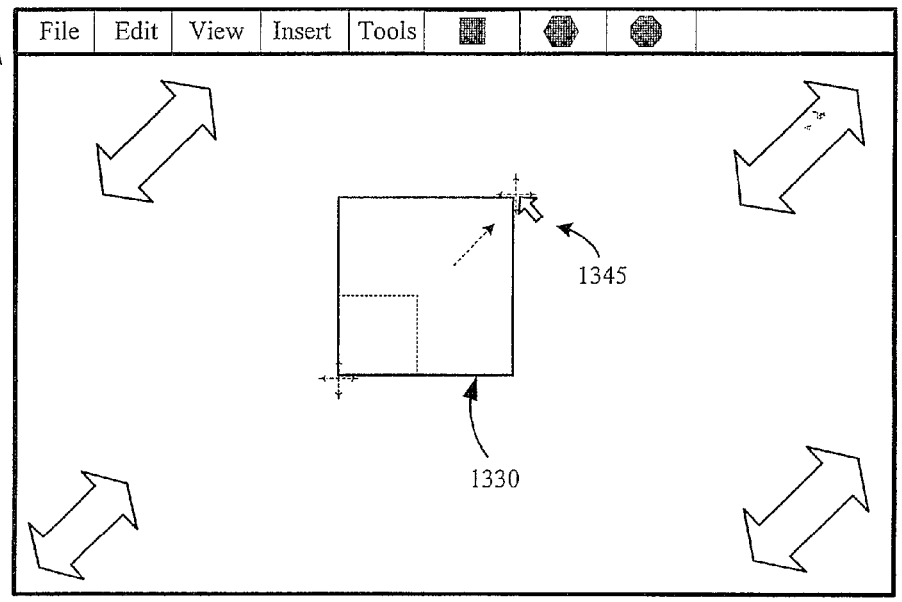

Another method of creating an LPDR according to some embodiments of the invention is called the "select and expand" method. In this method, after selecting a desired LPDR, a user can specify an exact location and size of an LPDR to be created. FIGS. 13E and 13F illustrate a user creating an LPDR using the select and expand method according to some embodiments of the invention. Specifically, FIG. 13E shows a user placing a cursor 1345 over a desired location to create an LPDR within the design window 1300 after previously selecting a square LPDR shape. The square LPDR-shape 1310 on the menu bar is shaded to indicate the user's selection. The small dashed-arrow next to cursor 1345 represents the user "clicking and dragging" the cursor 1345 up and to the left in order to "expand" an LPDR. As a result, an LPDR 1330 is created as shown in FIG. 13F.

Specifically, FIG. 13F illustrates the expansion of an LPDR as the cursor 1345 is directed radially outward from the desired location where the user started the click and drag operation. The dashed regions represent intermediate stages of the expansion. In this example, the starting location of the click and drag operation specifies a corner vertex of the "expanded" LPDR 1330. However, in other embodiments the starting location of the click and drag operation specifies the center of an expanded LPDR.

Figure 14A:
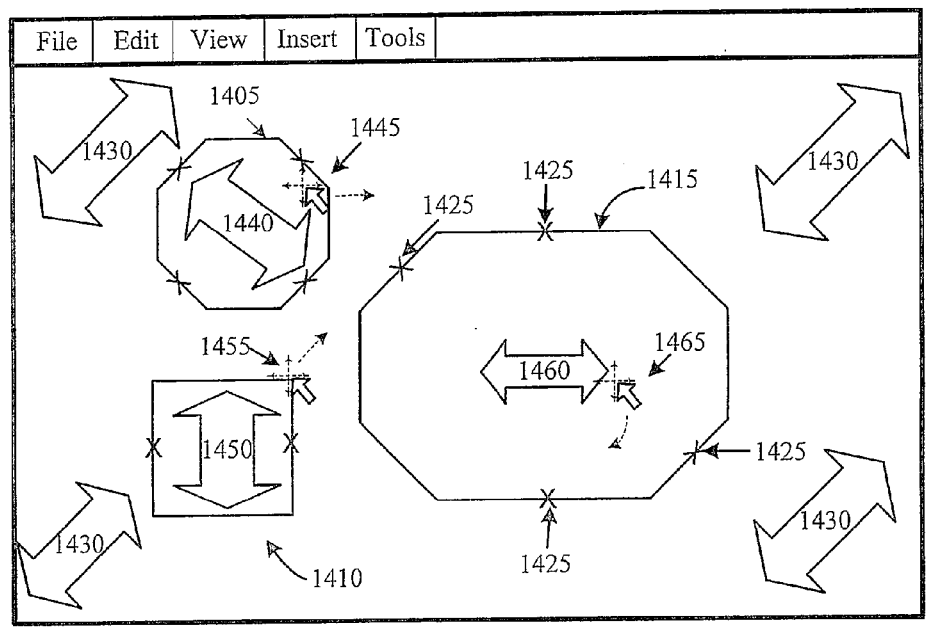
FIGS. 14A and 14B illustrate a user manipulating attributes of LPD regions in a design window of the Graphical User Interface according to some embodiments of the invention.
Figure 14B:
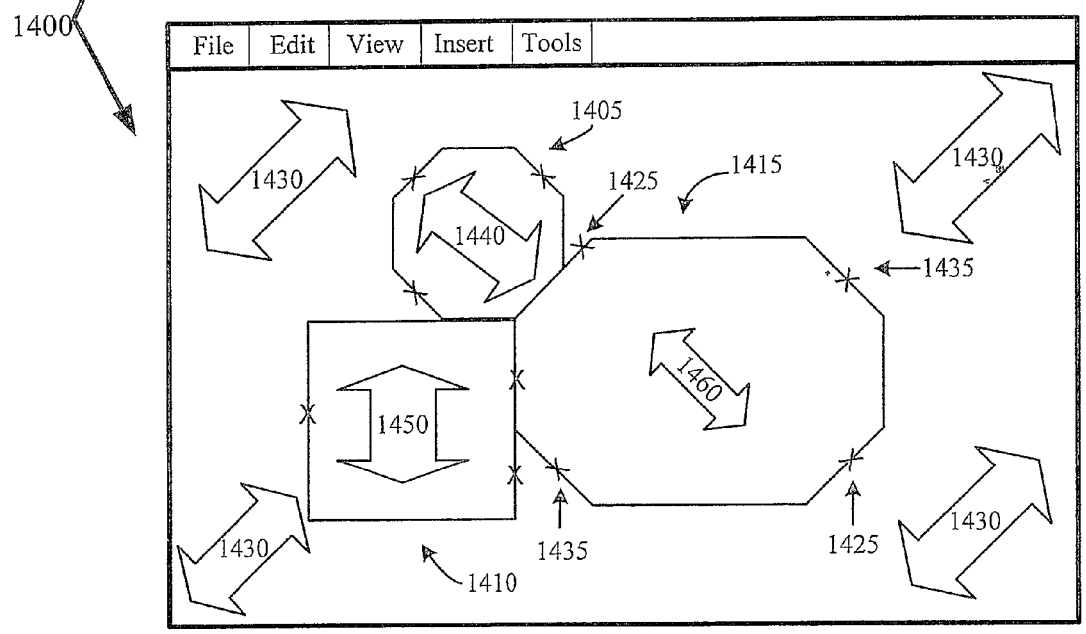

Once an LPDR is created in the design window, the GUI presents the user with different ways to manipulate the attributes of an LPDR. Some embodiments of the invention allow a user to resize an LPDR region within the design window. One method would be to place a cursor over the vertex of two sides of a particular LPDR and perform a "select and drag" operation directed radially outward/inward from the LPDR. Referring again to FIG. 14A, a cursor 1455 is placed over the upper-right corner vertex of LPDR 1410. The small dashed-arrow next to cursor 1455 represents the user "clicking and dragging" the cursor 1455 along a 45° direction (radially outward. As a result, LPDR 1410 is resized to be larger as illustrated in FIG. 14B. Typically, when resizing an LPDR by moving a vertex, the aspect ratio of the sides of the LPDR is maintained as this example demonstrates.

Another method to resize an LPDR is by "selecting and dragging" a boundary edge of a particular LPDR. This method is performed the same as described above except a user selects a boundary edge of an LPDR instead of a vertex. However, these methods typically provide different results as the aspect ratios of the sides of the LPDR are not usually maintained when resizing an LPDR by moving a boundary edge. Instead, adjoining boundary edges are "stretched" or "compacted" to conform with the movement of the particular boundary edge.

In addition to re-sizing an LPDR, some embodiments of the invention allow a user to move an LPD region within the design window. To do so, a user would place a cursor over the surface of a particular LPDR and perform a "select and drag" operation along a desired direction. Specifically, FIGS. 14A and 14B illustrate a design window 1400 representing a wiring layer that has a diagonal global preferred direction. Within the design window 1400 are three LPDRs 1405, 1410, and 1415 that have various convex shapes and local preferred directions. FIG. 14A illustrates a cursor 1445 placed over the surface of LPDR 1405. The small dashed-arrow next to cursor 1445 represents the user "clicking and dragging" the cursor 1445 to the right. As a result, LPDR 1405 is moved to the right along a horizontal direction as illustrated in FIG. 14B.

Another attribute of LPDRs that the GUI of some embodiments can manipulate is the local preferred direction of LPDRs. In some embodiments, the direction arrows that represent the directions of LPDRs are user-selectable and can be manipulated by various methods. For example, some embodiments of the invention provide a user with a "menu window" method to manipulate a selected direction arrow by choosing a particular direction from a menu widow that lists typical preferred directions. Alternatively, a "select and drag" method permits a user to select a particular direction arrow with a cursor and then "drag" the direction arrow in a circular motion to arrive at any desired position. A variation of this "select and drag" method is called the "select and snap" method. The "select and snap" method permits a user to manipulate a direction arrow in the same way as the "select and drag" method except that a selected direction arrow "snaps" progressively through allowed preferred directions when dragged in a circular motion (i.e. from 0°, 45°, 90°, 135°, etc.). Typically, the specific preferred directions "allowed" are in increments of 45° from a standard horizontal axis, however some embodiments of the invention specify the "allowed" preferred directions according to other degree increments.

A user's manipulation of a direction arrow using this "select and snap" method can be seen by referring again to FIGS. 14A and 14B. These figures illustrate a cursor 1465 pointing to a direction arrow 1460 of LPDR 1415. The small dashed-arrow under the cursor represents the user "dragging" the cursor 1445 clockwise/downward after selecting the direction arrow 1460. As a result, the selected direction arrow 1460 is "snapped" from a horizontal direction to a −45° direction as illustrated in FIG. 14B.

As a result of a change to a region's preferred direction, some embodiments of the invention update the indication of any impermeable edges of the LPDRs within the design window. As shown in FIG. 14A, four impermeable edge indicators 1425 are superimposed on the respective impermeable edges of LPDR 1415. Specifically, the impermeable edges along the top and bottom of LPDR 1415 are due to the LPDR's horizontal local preferred direction. When the local preferred direction of LPDR 1415 is changed to a −45° direction as illustrated in FIG. 14B, these two upper and lower edge indicators 1425 are removed. However, the other two indicators 1425 remain as they represent the impermeable edges of LPDR 1415 are due to the diagonal preferred direction of the layer in design window 1400. In addition, this figure shows two impermeable edge indicators 1435 added to the upper right and lower left edges of LPDR 1415 as a result of the changed −45° local preferred direction of the LPDR 1415.

Figure 15A:
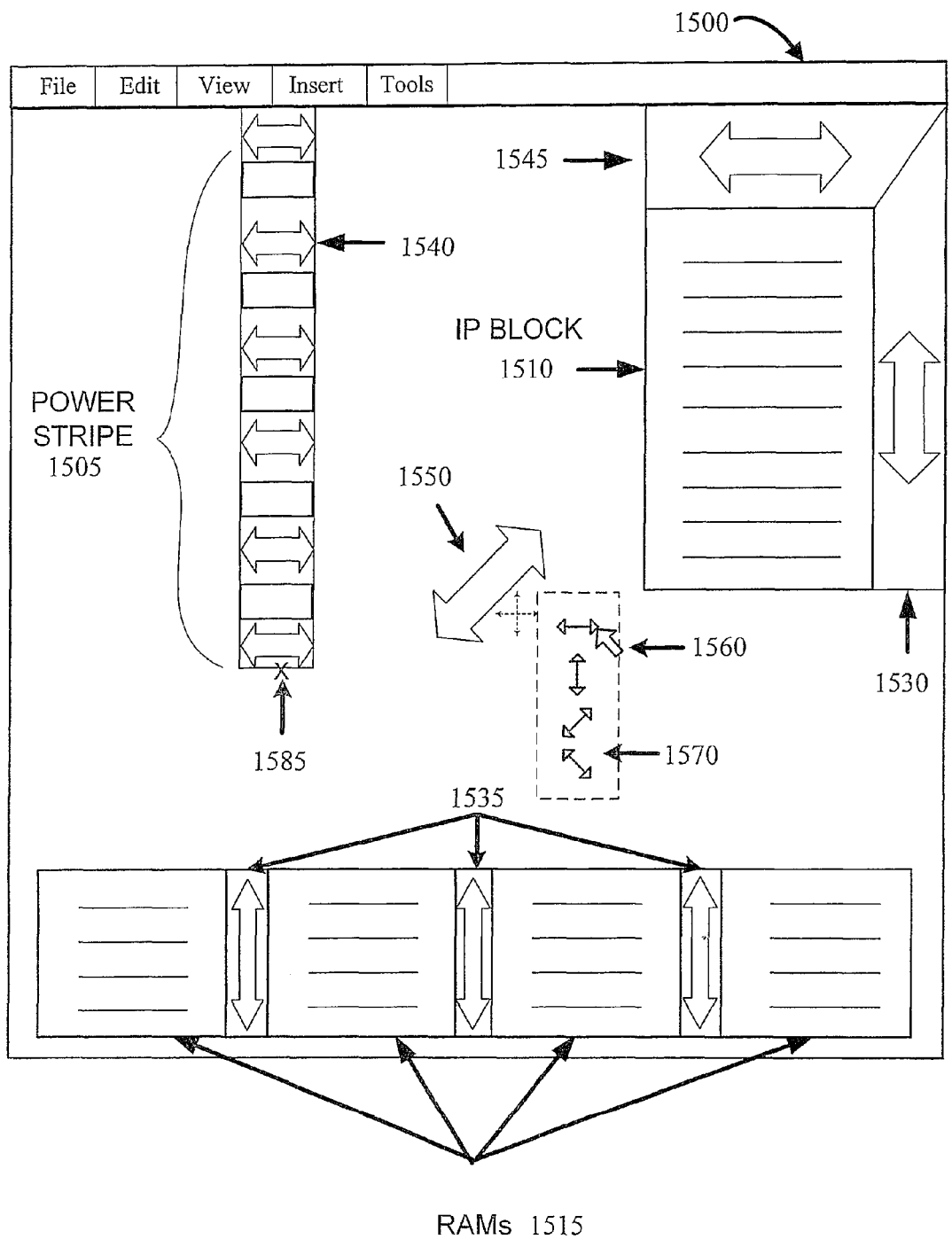
FIGS. 15A and 15B illustrate a user employing a "menu window" method to manipulate the preferred direction of an LPD region in a design window of a Graphical User Interface according to some embodiments of the invention.
Figure 15B:
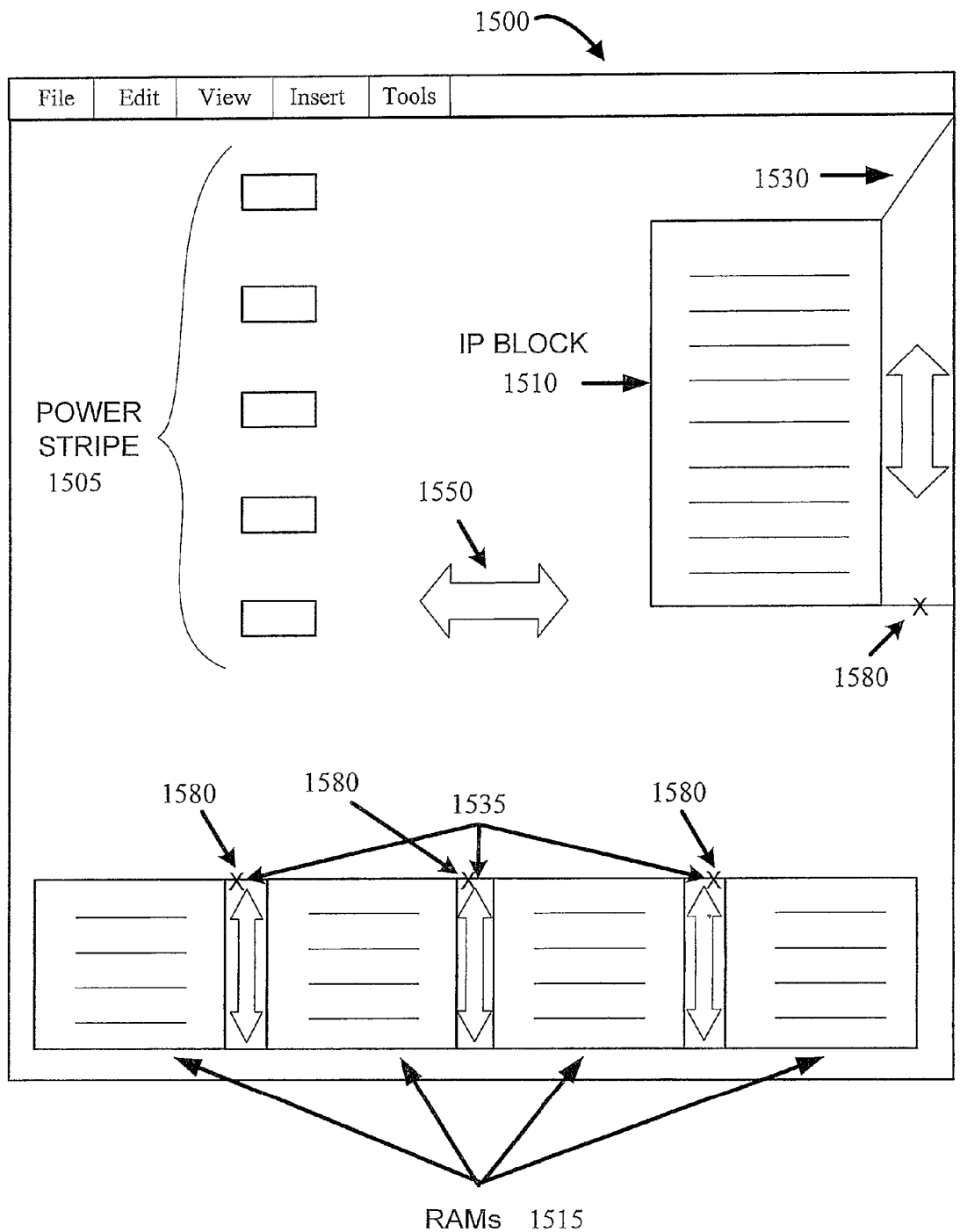

The alternate "menu window" method of manipulating the preferred direction of a region or layer as opposed to the previously described "select and snap" method is illustrated in FIGS. 15A and 15B. Specifically, FIG. 15A illustrates a user selecting a direction arrow by pointing a cursor 1560 at a direction arrow 1550 and then using a pointing device to open a menu window. Typically, a user opens this menu window by "right-clicking" a pointing device. However, the GUI can be configured to open the menu window via other input methods. In this example, a "right-click" over the selected direction arrow 1550 prompts the GUI to display a "direction menu-window" 1570. This direction menu-window presents four arrows representing the four standard preferred directions—horizontal, vertical, 45°, and −45°. Other embodiments display a "direction menu window" that present preferred directions other than the standard four identified above. In this example, the user selects the horizontal direction by pointing the cursor 1560 at the horizontal arrow in the direction window 1570. As a result, the selected direction arrow 1550 is changed from the 45° direction to the horizontal direction as illustrated in FIG. 15B.

As shown in FIG. 15B, the direction arrow 1550 is now oriented horizontally. As a result of this change to the global direction of the wiring layer, the GUI in some embodiments of the invention removes any LPDRs that have local preferred directions that run parallel to the new global preferred direction. For example, LPDRs 1540 and 1545 that have 0° local preferred directions previously illustrated in FIG. 15A are now removed from the GUI design window as shown in FIG. 15B. In addition, the GUI in some embodiments of the invention responds to this change in global direction of the wiring layer by identifying any impermeable edges of the remaining LPD regions. As shown in FIG. 15B, "X" icons 1580 are super-imposed on the respective impermeable boundary edges of regions 1530 and 1535. This identification alerts the user to make changes to the layout to improve routabililty through these respective boundary edges (i.e. by adding "crowns").

Figure 15C:
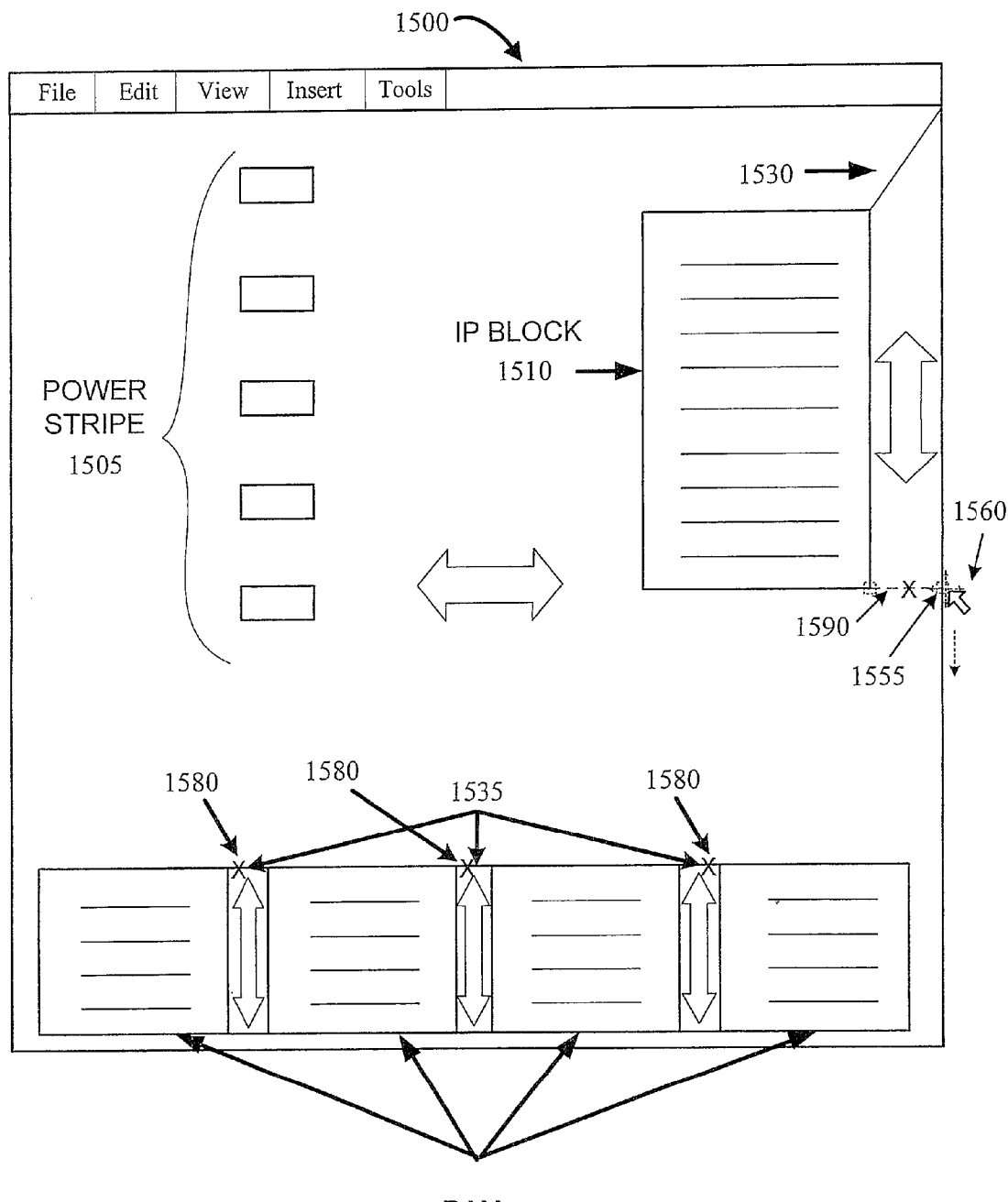
FIGS. 15C and 15D illustrate a user "crowning" an LPD region in a design window of a Graphical User Interface according to some embodiments of the invention.
Figure 15D:
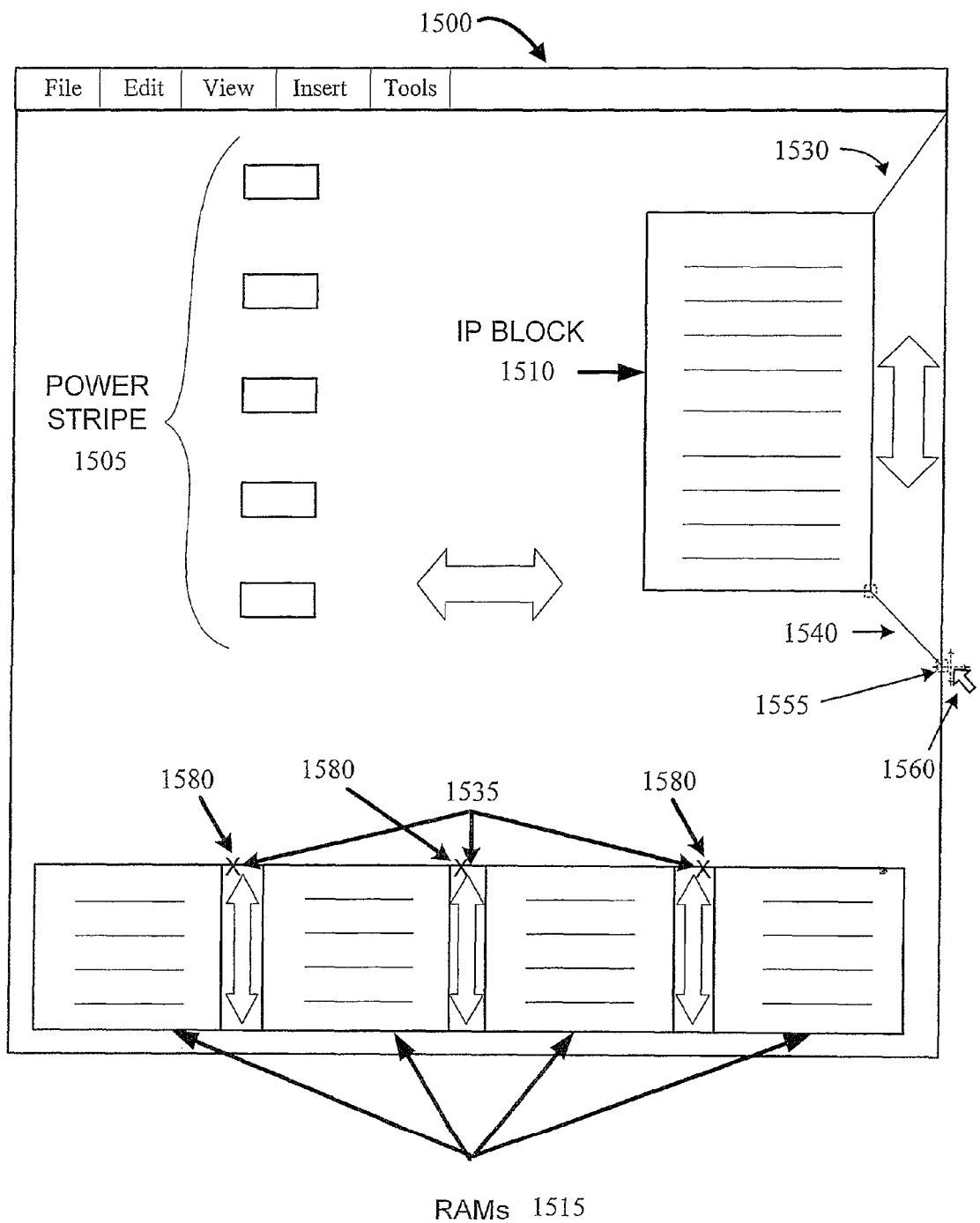

In order to extend these impermeable boundary edges to form "crowns", the GUI according to some embodiments of the invention enables a user to select impermeable boundary edges for crowning. The "crowning" of an LPDR is illustrated in FIGS. 15C and 15D. Specifically, FIG. 15C illustrates a user selecting an impermeable boundary edge by pointing a cursor 1560 at a vertex 1555 of the impermeable boundary edge 1590 (represented by a dashed line) of region 1530. The vertical arrow under the cursor represents the user "dragging" the cursor 1560 downward after selecting the vertex 1555 of impermeable boundary edge 1590. As a result, the selected impermeable boundary edge 1590 is extended into the wiring layer to form a crown on region 1530 as illustrated in FIG. 15D.

All impermeable boundary edges have at least two vertices that represent the end-points of the edge. In this example, the user extended such a vertex of an impermeable boundary edge to form a triangular-shaped crown. However, a user can also create additional vertices for an impermeable boundary edge in order to define differently shaped crowns. Some embodiments allow a user to create and extend a vertex at any mid-point along an LPDR boundary edge by performing a click and drag operation at a desired mid-point on the edge as shown in FIGS. 16A and 16B.

Figure 16A:
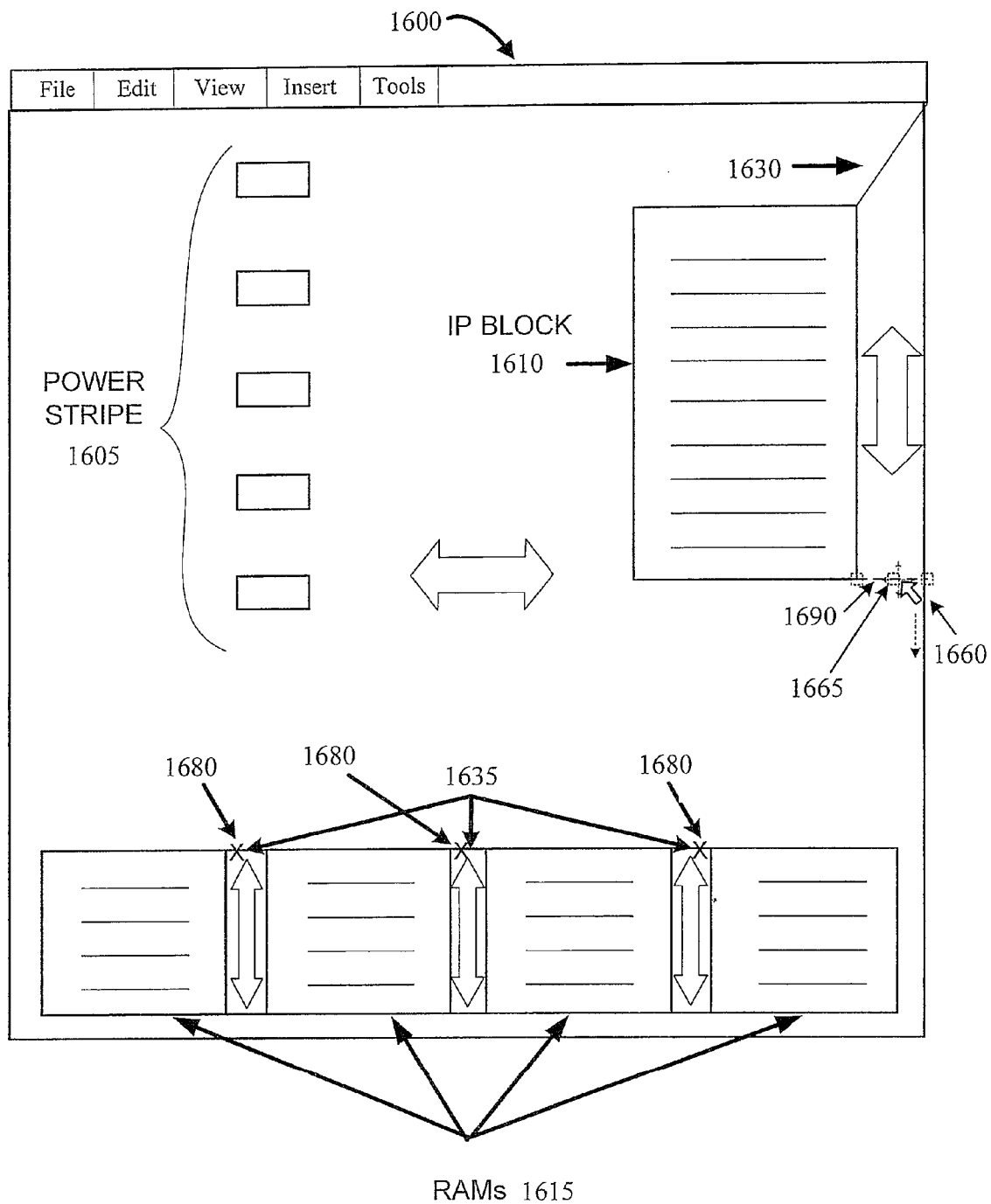
FIGS. 16A and 16B illustrate a user adding a vertex to an impermeable boundary edge and "crowning" an LPD region in a design window of the Graphical User Interface according to some embodiments of the invention.
Figure 16B:
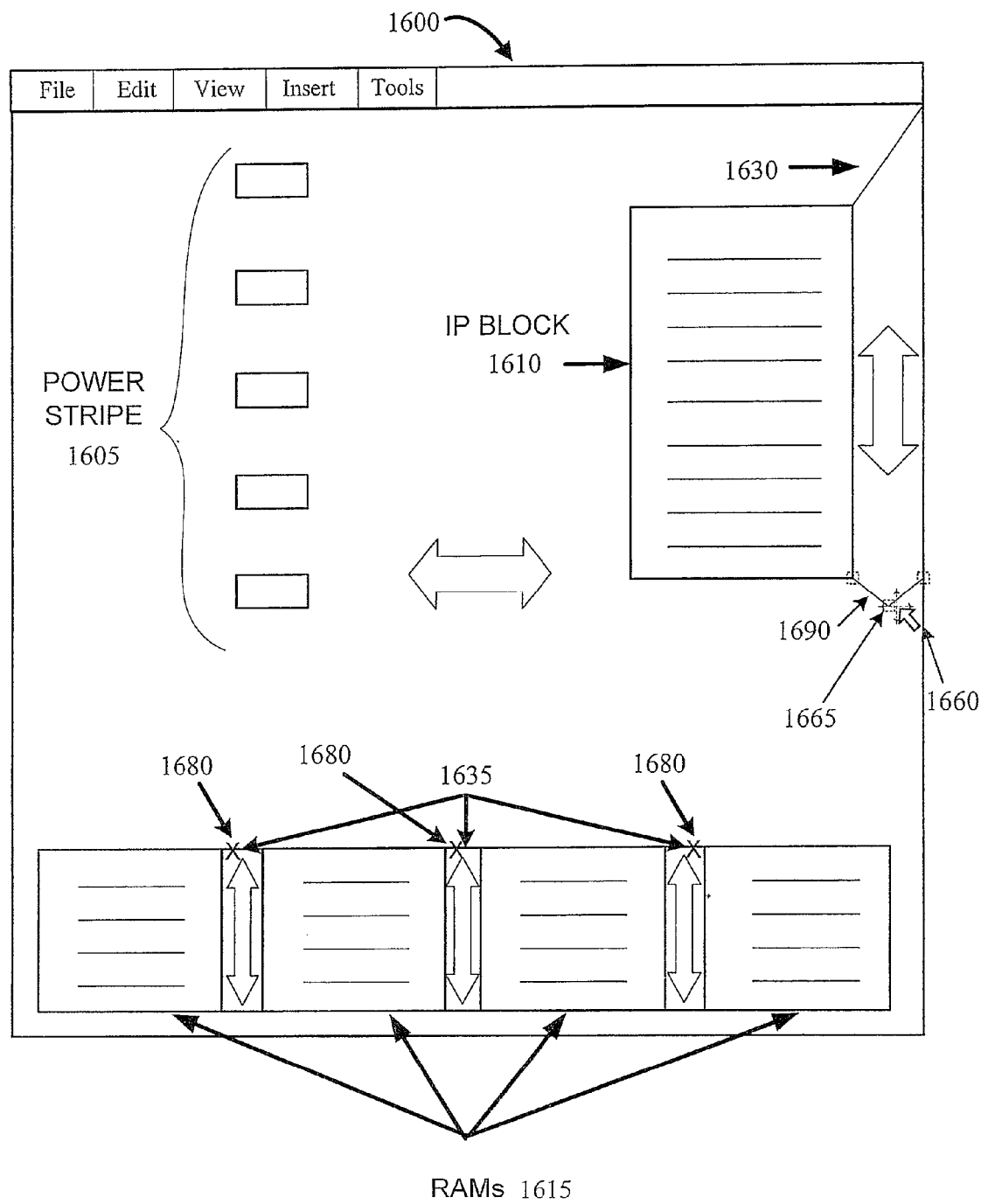

Specifically, FIG. 16A illustrates a user adding a vertex 1665 to impermeable boundary edge 1690 by selecting a mid-point on the edge with cursor 1660. This example also illustrates a user "dragging" the cursor 1660 downward after selecting the vertex 1565 of impermeable boundary edge 1690. As a result, the selected impermeable boundary edge 1690 is extended into the wiring layer to form a crown on region 1630 as illustrated in FIG. 16B. This ability to add vertices to boundary edges provides a user with the flexibility to define crowns of various shapes.

U.S. patent application 11/005,162, now issued as U.S. Pat. No. 7,707,537, entitled "Method and Apparatus for Generating Layout Regions with Local Preferred Directions," filed concurrently with the present application, describes an auto LPDR generator of some embodiments of the invention. Also, U.S. patent application Ser. No. 11/005,448, now issued as U.S. Pat. No. 7,340,711, entitled "Local Preferred Direction Routing," filed concurrently with the present application, describes the routing tools that can route a layout with LPD's. These applications are incorporated herein by reference. Other EDA tools can also consider layouts with LPD's. For instance, some embodiments might include a placer that computes placement costs (e.g., wirelength and/or congestion costs) based on the different LPD's within which the circuit modules or the pins of these modules fall.

While the invention has been described with reference to numerous specific details, one of ordinary skill in the art will recognize that the invention can be embodied in other specific forms without departing from the spirit of the invention. For instance, some embodiments define a crown boundary between an LPDR with a Manhattan LPD (e.g., a horizontal direction) and an LPDR with a non-Manhattan LPD (e.g., a 45° diagonal direction) in terms of an angle that is between the Manhattan and non-Manhattan directions (e.g., a 22.5° direction). Thus, one of ordinary skill in the art would understand that the invention is not to be limited by the foregoing illustrative details, but rather is to be defined by the appended claims.

We claim:

1. A design layout comprising:
a wiring layer;
on the wiring layer, a block that is an obstacle to wiring on the wiring layer;
on the wiring layer, a first region having a first local preferred wiring direction; and
on the wiring layer, a second region adjacent to the block and having a second local preferred wiring direction that is different than the first local preferred wiring direction, wherein the local preferred wiring direction of a region is a wiring direction that is more preferable within the region than any other wiring direction, wherein the second local preferred wiring direction of the second region is based on a geometric attribute of said block.

2. The design layout of claim 1, wherein the block is a first block, the design layout further comprising a second block positioned on said wiring layer, wherein said second local preferred wiring direction of the second region is further based on a geometric attribute of the second block.

3. The design layout of claim 1, wherein the block is a power stripe.

4. The design layout of claim 1, wherein the first local preferred wiring direction of the first region of the wiring layer is a diagonal preferred wiring direction.

5. The design layout of claim 1, wherein the block is a pre-designed circuit block.

6. The design layout of claim 1, wherein the block is a memory array.

7. The design layout of claim 1, wherein the block is an IP block.

8. The design layout of claim 1, wherein the geometric attribute of the block comprises a shape of the block.

9. The design layout of claim 1, wherein the geometric attribute of the block comprises an orientation of at least one of a plurality of edges of the block.

10. The design layout of claim 1, wherein the second region includes a crown sub-region.

11. The design layout of claim 10, wherein the crown sub-region comprises at least one boundary edge that is neither parallel nor orthogonal to the second local preferred wiring direction of the second region.

12. The design layout of claim 10, wherein the crown sub-region comprises a triangular shape.

13. The design layout of claim 12, wherein the triangular shape is a right triangle.

14. The design layout of claim 12, wherein the triangular shape is an isosceles triangle.

15. The design layout of claim 1, wherein the second local preferred wiring direction of the second region allows for wiring to be defined in the second region to avoid said block.

16. The design layout of claim 1, wherein the second local preferred wiring direction is parallel to an edge of the second region.

17. An integrated circuit ("IC") comprising:
   a wiring layer;
   on the wiring layer, a block that is an obstacle to wiring on the wiring layer;
   on the wiring layer, a first region having a first local preferred wiring direction; and
   on the wiring layer, a second region adjacent to the block and having a second local preferred wiring direction that is different than the first local preferred wiring direction, wherein the local preferred wiring direction of a region is a wiring direction that is more preferable within the region than any other wiring direction, wherein the second local preferred wiring direction of the second region is based on a geometric attribute of said block.

18. The IC of claim 17, wherein the block is a first block, the IC further comprising a second block positioned on said wiring layer, wherein said second local preferred wiring direction of the second region is further based on a geometric attribute of the second block.

19. The IC of claim 17, wherein the block is a power stripe.

20. The IC of claim 17, wherein the first local preferred wiring direction of the first region of the wiring layer is a diagonal preferred wiring direction.

21. The IC of claim 17, wherein the block is a pre-designed circuit block.

22. The IC of claim 17, wherein the block is a memory array.

23. The IC of claim 17, wherein the block is an IP block.

24. The IC of claim 17, wherein the geometric attribute of the block comprises a shape of the block.

25. The IC of claim 17, wherein the geometric attribute of the block comprises an orientation of at least one of a plurality of edges of the block.

26. The IC of claim 17, wherein the second region includes a crown sub-region.

27. The IC of claim 26, wherein the crown sub-region comprises at least one boundary edge that is neither parallel nor orthogonal to the second local preferred wiring direction of the second region.

28. The IC of claim 26, wherein the crown sub-region comprises a triangular shape.

29. The IC of claim 17, wherein the second local preferred wiring direction of the second region is parallel to an edge of the second region.

* * * * *